United States Patent
Ali et al.

(10) Patent No.: US 10,953,793 B2
(45) Date of Patent: Mar. 23, 2021

(54) HAPTIC FUNCTION LEATHER COMPONENT AND METHOD OF MAKING THE SAME

(71) Applicant: Honda Motor Co., Ltd., Tokyo (JP)

(72) Inventors: Zainab I. Ali, Marysville, OH (US); Patricia A. Scott, Galloway, OH (US)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 16/186,870

(22) Filed: Nov. 12, 2018

(65) Prior Publication Data

US 2019/0077311 A1 Mar. 14, 2019

Related U.S. Application Data

(63) Continuation-in-part of application No. 15/635,838, filed on Jun. 28, 2017, and a continuation-in-part of
(Continued)

(51) Int. Cl.
*H02J 7/00* (2006.01)
*B60Q 3/70* (2017.01)
(Continued)

(52) U.S. Cl.
CPC ............... *B60Q 3/70* (2017.02); *B32B 3/30* (2013.01); *B32B 9/025* (2013.01); *B60K 37/06* (2013.01);
(Continued)

(58) Field of Classification Search
CPC ...................................................... B60Q 3/70
(Continued)

(56) References Cited

U.S. PATENT DOCUMENTS 3,049,077 A 8/1962 Damm, Jr.
3,075,280 A 1/1963 Jack et al.
(Continued)

FOREIGN PATENT DOCUMENTS

AT 519037 3/2018
AT 519702 9/2018
(Continued)

OTHER PUBLICATIONS

Fukuyama et al.: "Multi-Layered Fabric Electrode for Movement Artifact Reduction in Capacitive ECG Measurement" Conf Proc IEEE Eng Med Biol Soc. 2013;2013:555-8.
(Continued)

*Primary Examiner* — Suchin Parihar
(74) *Attorney, Agent, or Firm* — Rankin, Hill & Clark LLP

(57) ABSTRACT

A functional vehicle component and related methods include a functional leather assembly fixed over a vehicle component. The functional leather assembly includes a leather sheet, a flexible electronic circuit arranged on a first surface of the leather sheet that faces away from the vehicle component to thereby define an outermost surface of the leather sheet, and including a piezoelectric switch that can be actuated to make or break a conductive path in the circuit; and a pigmented coating arranged over the circuit. Upon actuation of the piezoelectric switch to make or break the conductive path in the circuit, the piezoelectric switch provides a haptic signal that indicates the actuation of the piezoelectric switch.

20 Claims, 4 Drawing Sheets

Related U.S. Application Data application No. 15/635,803, filed on Jun. 28, 2017, and a continuation-in-part of application No. 15/635,862, filed on Jun. 28, 2017.

(60) Provisional application No. 62/667,178, filed on May 4, 2018.

(51) Int. Cl.

| | | |
|---|---|---|
| *H01L 33/62* | (2010.01) | |
| *H01L 25/16* | (2006.01) | |
| *H01L 41/053* | (2006.01) | |
| *H01L 33/44* | (2010.01) | |
| *H01L 23/538* | (2006.01) | |
| *B60Q 9/00* | (2006.01) | |
| *B62D 1/04* | (2006.01) | |
| *B60K 37/06* | (2006.01) | |
| *B32B 9/02* | (2006.01) | |
| *B32B 3/30* | (2006.01) | |
| *B60R 13/02* | (2006.01) | |
| *H01L 41/317* | (2013.01) | |
| *B62D 1/06* | (2006.01) | |
| *B60R 16/02* | (2006.01) | |
| *B60Q 3/283* | (2017.01) | |
| *B60Q 3/14* | (2017.01) | |
| *B60Q 3/217* | (2017.01) | |
| *B60Q 3/233* | (2017.01) | |
| *B60R 16/027* | (2006.01) | |

(52) U.S. Cl.
CPC .............. *B60Q 9/00* (2013.01); *B60R 13/02* (2013.01); *B60R 16/02* (2013.01); *B62D 1/046* (2013.01); *B62D 1/06* (2013.01); *H01L 23/5387* (2013.01); *H01L 25/167* (2013.01); *H01L 33/44* (2013.01); *H01L 33/62* (2013.01); *H01L 41/0533* (2013.01); *H01L 41/317* (2013.01); *B32B 2255/24* (2013.01); *B32B 2255/26* (2013.01); *B32B 2457/00* (2013.01); *B32B 2605/003* (2013.01); *B60K 2370/1446* (2019.05); *B60K 2370/158* (2019.05); *B60K 2370/782* (2019.05); *B60Q 3/14* (2017.02); *B60Q 3/217* (2017.02); *B60Q 3/233* (2017.02); *B60Q 3/283* (2017.02); *B60Q 2500/10* (2013.01); *B60R 13/0243* (2013.01); *B60R 13/0256* (2013.01); *B60R 13/0262* (2013.01); *B60R 16/027* (2013.01); *B60R 2013/0287* (2013.01); *H01L 2933/0025* (2013.01); *H01L 2933/0066* (2013.01)

(58) Field of Classification Search
USPC ......................................................... 320/108
See application file for complete search history.

(56) References Cited

U.S. PATENT DOCUMENTS

| | | | |
|---|---|---|---|
| 3,391,846 | A | 7/1968 | White |
| 3,549,304 | A | 12/1970 | Ebel et al. |
| 4,964,674 | A | 10/1990 | Altmann et al. |
| 5,002,335 | A | 3/1991 | Bengtsson |
| 5,622,652 | A | 4/1997 | Kucherovsky et al. |
| 5,624,736 | A | 4/1997 | DeAngelis et al. |
| 5,763,058 | A | 6/1998 | Isen et al. |
| 5,843,263 | A | 12/1998 | Mitchell |
| 5,948,297 | A | 9/1999 | Haubner et al. |
| 6,106,920 | A | 8/2000 | Pichon et al. |
| 6,311,350 | B1 | 11/2001 | Kaiserman et al. |
| 6,345,839 | B1 | 2/2002 | Kuboki et al. |
| 6,371,604 | B1 | 4/2002 | Yamane et al. |
| 6,395,121 | B1 | 5/2002 | De Bastiani |
| 6,545,236 | B2 | 4/2003 | Valk et al. |
| 6,579,593 | B1 | 6/2003 | Mori et al. |
| 6,607,681 | B1 | 8/2003 | Ito et al. |
| 6,652,128 | B2 | 11/2003 | Misaras |
| 6,697,694 | B2 | 2/2004 | Mogensen |
| 6,729,025 | B2 | 5/2004 | Farrell et al. |
| 6,820,897 | B2 | 11/2004 | Breed et al. |
| 6,868,934 | B2 | 3/2005 | Dirrig |
| 7,301,351 | B2 | 11/2007 | Deangelis et al. |
| 7,395,717 | B2 | 7/2008 | DeAngelis et al. |
| 7,432,459 | B2 | 10/2008 | Stoschek et al. |
| 7,516,809 | B2 | 4/2009 | Hetzenecker et al. |
| 7,710,279 | B1 | 5/2010 | Fields |
| 7,719,007 | B2 | 5/2010 | Tompkins et al. |
| 7,808,488 | B2 | 10/2010 | Martin et al. |
| 7,989,725 | B2 | 8/2011 | Boddie et al. |
| 8,114,791 | B2 | 2/2012 | Child et al. |
| 8,315,061 | B2 | 11/2012 | Ullmann et al. |
| 8,330,079 | B2 | 12/2012 | Yasuda et al. |
| 8,463,352 | B2 | 6/2013 | Song |
| 8,497,850 | B2 | 7/2013 | Foerster et al. |
| 8,506,141 | B2 | 8/2013 | Cannon et al. |
| 8,507,102 | B1 | 8/2013 | O'Leary |
| 8,552,299 | B2 | 10/2013 | Rogers et al. |
| 8,587,422 | B2 | 11/2013 | Andrews et al. |
| 8,704,758 | B1 | 4/2014 | Figley et al. |
| 8,725,230 | B2 | 5/2014 | Lisseman et al. |
| 8,732,866 | B2 | 5/2014 | Genz et al. |
| 8,784,342 | B2 | 7/2014 | Hyde et al. |
| 8,804,344 | B2 | 8/2014 | Moncrieff |
| 8,985,012 | B2 | 3/2015 | Yiannakou |
| 8,999,431 | B2 | 4/2015 | Nagarajan et al. |
| 9,108,402 | B2 | 8/2015 | Sudo et al. |
| 9,112,363 | B2 | 8/2015 | Partovi |
| 9,159,221 | B1 | 10/2015 | Stantchev |
| 9,180,803 | B2 | 11/2015 | Cleary et al. |
| 9,192,031 | B2 | 11/2015 | Deyaf |
| 9,210,498 | B1 | 12/2015 | Shaffer |
| 9,372,123 | B2 | 6/2016 | Li et al. |
| 9,403,460 | B2 | 8/2016 | Hickey et al. |
| 9,416,495 | B2 | 8/2016 | Depres et al. |
| 9,421,884 | B2 | 8/2016 | Boyer et al. |
| 9,448,631 | B2 | 9/2016 | Winter et al. |
| 9,481,297 | B2 | 11/2016 | Salter et al. |
| 9,554,732 | B2 | 1/2017 | Schaffer |
| 9,576,446 | B2 | 2/2017 | Zellers |
| 9,672,703 | B2 | 6/2017 | Alexiou et al. |
| 9,715,687 | B1 | 7/2017 | Lau et al. |
| 9,723,122 | B2 | 8/2017 | Ghaffari et al. |
| 9,724,869 | B2 | 8/2017 | Niskala et al. |
| 9,800,079 | B2 | 10/2017 | Wippler |
| 9,821,680 | B2 | 11/2017 | Lange-Mao |
| 9,873,446 | B2 | 1/2018 | Gardner et al. |
| 9,875,866 | B2 | 1/2018 | Liao et al. |
| 9,886,093 | B2 | 2/2018 | Moussette et al. |
| 9,973,021 | B2 | 5/2018 | Leabman et al. |
| 10,638,618 | B1 * | 4/2020 | Teil .................. G06F 3/0202 |
| 2002/0084721 | A1 | 7/2002 | Walczak |
| 2002/0104746 | A1 * | 8/2002 | Valk .................. B60N 2/0228 |
| | | | 200/61.54 |
| 2007/0052529 | A1 | 3/2007 | Perez |
| 2007/0149001 | A1 | 6/2007 | Uka |
| 2007/0236450 | A1 * | 10/2007 | Colgate .................. G06F 3/016 |
| | | | 345/156 |
| 2007/0265738 | A1 | 11/2007 | Saito |
| 2008/0157533 | A1 | 7/2008 | Flottemesch et al. |
| 2008/0202912 | A1 | 8/2008 | Boddie et al. |
| 2008/0257706 | A1 * | 10/2008 | Haag ................ B29C 45/14655 |
| | | | 200/600 |
| 2008/0303800 | A1 * | 12/2008 | Elwell .................. G06F 3/0414 |
| | | | 345/173 |
| 2009/0004478 | A1 | 1/2009 | Baetzold et al. |
| 2009/0061251 | A1 | 3/2009 | Kirmeier |
| 2009/0108985 | A1 * | 4/2009 | Haag ................ B29C 45/14639 |
| | | | 338/248 |
| 2009/0251917 | A1 * | 10/2009 | Wollner ................ F21S 43/239 |
| | | | 362/543 |
| 2009/0301852 | A1 | 12/2009 | Keist et al. |

(56) References Cited

U.S. PATENT DOCUMENTS

| | | |
|---|---|---|
| 2010/0137702 A1 | 6/2010 | Park et al. |
| 2010/0206614 A1 | 8/2010 | Park et al. |
| 2011/0018498 A1 | 1/2011 | Soar |
| 2011/0209976 A1 | 9/2011 | Krier et al. |
| 2011/0267795 A1 | 11/2011 | Kim et al. |
| 2012/0113667 A1 | 5/2012 | Brandt et al. |
| 2012/0235566 A1 | 9/2012 | Karalis et al. |
| 2013/0160183 A1 | 6/2013 | Reho et al. |
| 2013/0192412 A1 | 8/2013 | Sekiya et al. |
| 2014/0022070 A1 | 1/2014 | Golomb |
| 2014/0036428 A1 | 2/2014 | Leong et al. |
| 2014/0084045 A1 | 3/2014 | Yang et al. |
| 2014/0109719 A1 | 4/2014 | Lisseman et al. |
| 2014/0203770 A1* | 7/2014 | Salter .................. H02J 7/0047 320/108 |
| 2014/0240132 A1 | 8/2014 | Bychkov |
| 2014/0246415 A1 | 9/2014 | Wittkowski |
| 2014/0265555 A1 | 9/2014 | Hall et al. |
| 2014/0310610 A1 | 10/2014 | Ricci |
| 2014/0354568 A1* | 12/2014 | Andrews ................ B60K 37/06 345/173 |
| 2015/0017421 A1 | 1/2015 | Sotzing |
| 2015/0077969 A1 | 3/2015 | Moncrieff |
| 2015/0175172 A1* | 6/2015 | Truong ................. B60W 50/10 701/36 |
| 2015/0196209 A1 | 7/2015 | Morris et al. |
| 2015/0250420 A1 | 9/2015 | Longinotti-Buitoni et al. |
| 2015/0261264 A1 | 9/2015 | Brown et al. |
| 2015/0288048 A1 | 10/2015 | Tang et al. |
| 2015/0344060 A1 | 12/2015 | Staszak et al. |
| 2015/0376832 A1 | 12/2015 | Li et al. |
| 2015/0378254 A1 | 12/2015 | Wang et al. |
| 2016/0004362 A1 | 1/2016 | Kring et al. |
| 2016/0007475 A1 | 1/2016 | Zanesi |
| 2016/0042268 A1 | 2/2016 | Puttkammer |
| 2016/0144690 A1 | 5/2016 | Wittkowski et al. |
| 2016/0167130 A1 | 6/2016 | Ida et al. |
| 2016/0218712 A1 | 7/2016 | Ben Abdelziz |
| 2016/0264078 A1 | 9/2016 | McGuire, Jr. et al. |
| 2016/0272112 A1 | 9/2016 | DeGrazia et al. |
| 2016/0276865 A1 | 9/2016 | Pike et al. |
| 2016/0311366 A1 | 10/2016 | Lisseman |
| 2016/0327979 A1 | 11/2016 | Lettow |
| 2017/0012207 A1 | 1/2017 | Seo et al. |
| 2017/0022379 A1 | 1/2017 | Loccufier et al. |
| 2017/0038795 A1 | 2/2017 | Lettow et al. |
| 2017/0052624 A1 | 2/2017 | Hunt et al. |
| 2017/0061753 A1 | 3/2017 | Khoshkava et al. |
| 2017/0092098 A1 | 3/2017 | Alampallam et al. |
| 2017/0101547 A1 | 4/2017 | Loccufier et al. |
| 2017/0126228 A1* | 5/2017 | Gerken ............. H03K 17/9622 |
| 2017/0137050 A1 | 5/2017 | Michelmann et al. |
| 2017/0147106 A1 | 5/2017 | Kwon et al. |
| 2017/0166237 A1* | 6/2017 | Oh ......................... B60K 35/00 |
| 2017/0174124 A1* | 6/2017 | Salter ........................ F21K 9/64 |
| 2017/0291493 A1* | 10/2017 | Bostick .................. B60K 35/00 |
| 2017/0308778 A1 | 10/2017 | Foerster et al. |
| 2017/0310144 A1 | 10/2017 | Madau et al. |
| 2017/0311666 A1 | 11/2017 | Gladish et al. |
| 2017/0325518 A1 | 11/2017 | Poupyrev et al. |
| 2017/0325524 A1 | 11/2017 | Hyde et al. |
| 2017/0325525 A1 | 11/2017 | Hyde et al. |
| 2017/0326013 A1 | 11/2017 | Hyde et al. |
| 2017/0337462 A1 | 11/2017 | Thiele et al. |
| 2017/0341573 A1* | 11/2017 | Gerhard .................. B60Q 3/51 |
| 2018/0208111 A1 | 7/2018 | Lisseman et al. |
| 2018/0290356 A1 | 10/2018 | Isohatala et al. |
| 2018/0352661 A1 | 12/2018 | Yang et al. |
| 2019/0001879 A1* | 1/2019 | Ali .......................... B60Q 3/70 |
| 2019/0008050 A1* | 1/2019 | Ali ....................... H05K 3/1283 |
| 2019/0009812 A1* | 1/2019 | Jendrowski ............ G06F 3/016 |
| 2019/0077311 A1 | 3/2019 | Ali et al. |
| 2019/0135199 A1* | 5/2019 | Galan Garcia ........ B60K 35/00 |
| 2020/0192423 A1* | 6/2020 | Hsu ........................ G06F 1/163 |

FOREIGN PATENT DOCUMENTS

| | | |
|---|---|---|
| CN | 201405914 | 2/2010 |
| CN | 202138313 | 2/2012 |
| CN | 202765080 | 3/2013 |
| CN | 103618389 | 3/2014 |
| CN | 105196867 | 12/2015 |
| CN | 204926416 | 12/2015 |
| CN | 105507015 | 4/2016 |
| CN | 105951471 | 9/2016 |
| DE | 2026892 | 12/1971 |
| DE | 102010053354 | 8/2011 |
| DE | 202012004803 | 6/2012 |
| DE | 202013005923 | 7/2013 |
| DE | 202015001403 | 7/2015 |
| DE | 102015200264 | 7/2016 |
| DE | 102015200272 | 7/2016 |
| DE | 102016202013 | 8/2017 |
| EP | 1580080 | 9/2005 |
| EP | 2628627 | 8/2013 |
| GB | 1313537 | 4/1973 |
| JP | 2000500101 | 1/2000 |
| JP | 2008254485 | 10/2008 |
| JP | 2009018747 | 1/2009 |
| JP | 2009045077 | 3/2009 |
| JP | 2009119230 | 6/2009 |
| JP | 2009292167 | 12/2009 |
| JP | 20100129652 | 12/2010 |
| JP | 2014015145 | 1/2014 |
| JP | 2015054564 | 3/2015 |
| JP | 2016510286 | 4/2016 |
| JP | 2016073196 | 5/2016 |
| KR | 20120001064 | 2/2012 |
| KR | 20140110321 | 9/2014 |
| KR | 20150061894 | 6/2015 |
| KR | 20160089299 | 7/2016 |
| KR | 20180060758 | 6/2018 |
| TW | 201809286 | 3/2018 |
| WO | WO2002103718 | 12/2002 |
| WO | WO2007038950 | 4/2007 |
| WO | WO2011006641 | 1/2011 |
| WO | WO2011012225 | 2/2011 |
| WO | WO2015103563 | 7/2015 |
| WO | WO2015103565 | 7/2015 |
| WO | WO2015151595 | 10/2015 |
| WO | WO2016057487 | 4/2016 |
| WO | WO2016170160 | 10/2016 |
| WO | WO2017055685 | 4/2017 |
| WO | WO2015001665 | 1/2018 |
| WO | WO2018032026 | 2/2018 |

OTHER PUBLICATIONS

Heuer et al.: "Unobtrusive In-Vehicle Biosignal Instrumentation for Advanced Driver Assistance and Active Safety", 2010 IEEE EMBS Conference on Biomedical Engineering and Sciences (IECBES) Nov. 30-Dec. 2, 2010 (Abstract only).

Sangeetha et al.: "Stimuli Responsive Leathers Using Smart Retanning Agents", JALCA, vol. 107, 2012 (Abstract only).

International Search Report of Serial No. PCT/US2018/031803 dated Jul. 20, 2018, 2 pages.

Written Opinion of Serial No. PCT/US2018/031803 dated Jul. 20, 2018, 8 pages.

International Search Report of Serial No. PCT/US2018/031583 dated Jul. 20, 2018, 2 pages.

Written Opinion of Serial No. PCT/US2018/031583 dated Jul. 20, 2018, 7 pages.

Office Action of U.S. Appl. No. 15/635,838 dated Feb. 5, 2019, 46 pages.

Office Action of U.S. Appl. No. 16/185,633 dated Feb. 6, 2019, 22 pages.

Cooper, Tyler; "Wireless Inductive Power Night Light." Adafruit. https://learn.adafruit.com/wireless-inductive-power-night-light?view=all.

Rao, S.; "High-definition haptics: Feel the difference!", Texas Instruments Incorporated, Analog Applications Journal 3Q 2012, 6 pages.

(56) References Cited

OTHER PUBLICATIONS

Wang et al.; "Wireless Power Transfer System in the LED Lighting Application." 2015 12th China International Forum on Solid State Lighting (2015): 120-122.
International Search Report and Written Opinion of Serial No. PCT/US2018/032358 dated Jun. 21, 2018, 10 pages.
Office Action of U.S. Appl. No. 15/635,838 dated May 13, 2019, 22 pages.
Office Action of U.S. Appl. No. 15/635,838 dated Jun. 28, 2019, 14 pages.
Office Action of U.S. Appl. No. 16/185,633 dated Jun. 17, 2019, 17 pages.
Office Action of U.S. Appl. No. 15/635,862 dated Mar. 30, 2018, 17 pages.
Office Action of U.S. Appl. No. 15/635,862 dated Aug. 16, 2018, 12 pages.
Office Action of U.S. Appl. No. 15/635,803 dated Dec. 12, 2019, 48 pages.
Office Action of U.S. Appl. No. 15/635,838 dated Dec. 26, 2019, 21 pages.
J. Hoefler, B. Hageman, E Nungesser and R. Smith, "High-performance acrylic polymer technology", Leather International, Apr. 22, 2016.
Notice of Allowance of U.S. Appl. No. 15/635,838 dated Apr. 10, 2020, 17 pages.
Office Action of U.S. Appl. No. 16/396,397 dated Apr. 20, 2020, 59 pages.
Notice of Allowance of U.S. Appl. No. 16/185,633 dated Feb. 20, 2020, 26 pages.
Extended European Search Report of EP19219164.1 dated Jun. 4, 2020, 13 pages.
Davis, Alex; "Faurecia's Self-Driving Car Seat Knows When You Need a Massage", WIRED; Transportation, Nov. 17, 2015; https://www.wired.com/2015/11/faurecias-self-driving-car-seat-knows-when-you-need-a-massage.
Kindermann, "Automotive—Leather innovation from Wollsdorf—Smart Leather", Mar. 26, 2019, 2 pages.
Wollsdorf Leather, "Medical—Durability for Special applications indoors and outdoors", 2 pages.
TDK Group Company, Piezo Haptic Actuator—POwerHapTM, 15G Type, Preliminary data, Jun. 9, 2017, 9 pages.
Wollsdorf Leder "Wollsdorf Leder in the interior space", 4 pages, https://www.wollsdorf.com/w/en/products/upholstery/services/leder/.
Japanese Office Action of S/N 2020-519661 dated Oct. 13, 2020, 3 pages.
Office Action of U.S. Appl. No. 15/635,803 dated Jun. 24, 2020, 13 pages.
Notice of Allowance of U.S. Appl. No. 16/396,397 dated Aug. 21, 2020, 16 pages.
Office Action of U.S. Appl. No. 16/696,833 dated Aug. 4, 2020, 53 pages.
Afzali, A. and SH Maghsoodlou; "Nanostructured Polymer Blends and Composites in Textiles", Nanostructured Polymer Blends and Composites in Textiles (2016): 58. https://books.google.com/books?hl=en&lr=&id=upXwCgAAQBAJ&oi=fnd&pg=PA41&dq=leather+smart_material+OR+intelligent_material++vehicle+OR+automotive+OR+automobile+OR+car+OR+driver+illuminate+OR+color+&ots=EtKF9oClou&sig=dFB_31AgXvteP7vqBtl5R6_lsql#v=onepage&q&f=false.
CSIR-Central Leather Research Institute, "A novel bi-functional leather for smart product applications and a process for the preparation thereof" https://www.clri.org/Patents.aspx?P=22.
Wegene Jima Demisie, Thanikaivelan Palanisamy, Krishnaraj Kaliappa, Phebe Kavati, Chandrasekaran Bangaru; "Concurrent genesis of color and electrical conductivity in leathers through in-situ polymerization of aniline for smart product applications", Feb. 28, 2015 https://onlinelibrary.wiley.com/doi/abs/10.1002/pat.3483.
M. F. Farooqui and A. Shamim; "Dual band inkjet printed bow-tie slot antenna on leather", 2013 7th European Conference on Antennas and Propagation (EuCAP), Gothenburg, 2013, pp. 3287-3290. IEEE Xplorer.
S. Griffiths; Daily Mail.com, Sep. 23, 2015, "The smart car seat that tackles Road Rage: Chair gives drivers a relaxing massage or a blast of air to focus their attention" https://www.dailymail.co.uk/sciencetech/article-3246341/The-smart-car-seat-tackles-ROAD-RAGE-Chair-gives-drivers-relaxing-massage-blast-air-focus-attention.html.
J. Zaklit, Y. Wang, Y. Shen and N. Xi; "Quantitatively characterizing automotive interior surfaces using an Optical TIR-based texture sensor", 2009 IEEE International Conference on Robotics and Biomimetics (ROBIO), Guilin, 2009, pp. 1721-1726., doi: 10.1109/ROBIO.2009.5420440, IEEE Xplore.
International Search Report and Written Opinion of Serial No. PCT/US2020/023281 dated Jun. 8, 2020, 17 pages.
International Search Report and Written Opinion of Serial No. PCT/US2019/030130 dated Aug. 30, 2019, 33 pages.
Final Office Action of U.S. Appl. No. 16/185,633 dated Oct. 15, 2019, 30 pages.
Final Office Action of U.S. Appl. No. 15/635,838 dated Oct. 11, 2019, 31 pages.
Office Action of U.S. Appl. No. 16/857,548 dated Oct. 22, 2020, 48 pages.
Notice of Allowance of U.S. Appl. No. 16/396,397 dated Nov. 17, 2020, 19 pages.
Extended European Search Report of EP18822996.7 dated Jan. 14, 2021, 8 pages.
Office Action of U.S. Appl. No. 15/635,803 dated Dec. 24, 2020, 16 pages.
Office Action of U.S. Appl. No. 16/696,833 dated Janaury 11, 2021, 23 pages.

\* cited by examiner

HAPTIC FUNCTION LEATHER COMPONENT AND METHOD OF MAKING THE SAME

CROSS REFERENCE TO RELATED APPLICATION

This application is a continuation-in-part application of U.S. application Ser. No. 15/635,803 filed Jun. 28, 2017; is a continuation-in-part application of U.S. application Ser. No. 15/635,838 filed Jun. 28, 2017; is a continuation-in-part application of U.S. application Ser. No. 15/635,862 filed Jun. 28, 2017; and claims priority to U.S. Provisional Patent Application Ser. No. 62/667,178 filed May 4, 2018; all of which are expressly incorporated herein by reference.

BACKGROUND

Interior vehicle components often include a surface layer of premium natural leather. The leather is wrapped around and secured to an underlying structure. The leather is pliable, and thus conforms to the contours of the underlying structure. In luxury vehicles, leather is generally applied as a top layer to components that may come in direct contact with occupants of the vehicle, such as interior panels, seats, and door linings. The main function of the topcoat of leather is for aesthetics and to provide a luxurious look to the interior of the vehicle. However, natural leather offers no functionality to the vehicle components. Accordingly, there is a need for an improved top layer for vehicle components.

BRIEF DESCRIPTION

According to one aspect, a method of producing a functional leather component includes providing a leather sheet, applying a flexible electronic circuit to an A-surface of the leather sheet, and arranging a pigmented coating over the circuit.

According to another aspect, a method of producing a vehicle system includes applying a flexible electronic circuit to an A-surface of a leather sheet, electrically connecting a light source to the circuit, the light source configured to emit light when supplied with electrical power, arranging a pigmented coating over the circuit and over the light source, fixing the leather sheet over a surface of a vehicle component such that the A-surface of the leather sheet is facing away from the vehicle component, and connecting the circuit to a vehicle electronic control unit and a vehicle power source. Optionally, the pigmented coating inhibits or prevents the circuit and the light source from being visible through the pigmented coating. Light emitted by the light source is visible through the pigmented coating.

According to another aspect, a functional vehicle component includes a vehicle component, a leather sheet fixed over a surface of the vehicle component, a flexible electronic circuit contacting an A-surface of the leather sheet and including a printed and cured conductive ink, and a pigmented coating arranged over the electronic circuit.

According to another aspect, a vehicle system includes a vehicle power system and an electronic control unit electrically connected to the vehicle power system. The vehicle system also includes a functional vehicle component including a vehicle component, a leather sheet fixed over a surface of the vehicle component, a flexible electronic circuit contacting an A-surface of the leather sheet and including a printed and cured conductive ink, and a pigmented coating arranged over the electronic circuit. The circuit is electrically connected to the electronic control unit, which is configured to control operation of the functional vehicle component.

According to another aspect, a wireless charger for a vehicle includes a vehicle power source; and a wireless charging apparatus including a vehicle component, a leather sheet fixed over a surface of the vehicle component, a flexible electronic circuit contacting an A-surface of the leather sheet and including a printed and cured conductive ink, and a pigmented coating arranged over the circuit. The circuit is electrically connected to the power source and includes a wireless transmitter configured to generate an oscillating electromagnetic field when supplied with power from the power source.

According to another aspect, a smart functional vehicle component includes a vehicle component, a leather sheet fixed over a surface of the vehicle component, a flexible electronic circuit contacting an A-surface of the leather sheet and including a printed and cured conductive ink, a light source that emits light when electrical power is supplied to the light source, the light source being electrically connected to the circuit, and a pigmented coating arranged over the electronic circuit and over the light source.

According to another aspect, a vehicle system includes a vehicle power system; an electronic control unit electrically connected to the vehicle power system; and a smart functional vehicle component including a vehicle component, a leather sheet fixed over a surface of the vehicle component, a flexible electronic circuit contacting an A-surface of the leather sheet including a printed and cured conductive ink that is in electrical communication with the electronic control unit, a micro light emitting diode that emits light when electrical power is supplied to the micro light emitting diode from the vehicle power system, the micro light emitting diode being electrically connected to the circuit, and a pigmented coating arranged over the electronic circuit and over the micro light emitting diode. The electronic control unit is configured to control operation of the functional vehicle component.

According to another aspect, a smart functional vehicle steering wheel includes a vehicle steering wheel, a leather sheet fixed over a surface of the steering wheel, a flexible electronic circuit contacting an A-surface of the leather sheet and including a printed and cured conductive ink, and a pigmented coating arranged over the electronic circuit. The circuit extends around the entire circumference of the steering wheel and includes one or more pressure sensors arranged around the entire circumference of the steering wheel.

According to another aspect, a method of producing a functional leather component comprises providing a leather sheet; and applying to a first side of the leather sheet, a flexible electronic circuit including a piezoelectric switch that can be actuated to make or break a conductive path in the circuit. When the switch is actuated to make or break the conductive path in the circuit, the piezoelectric switch provides haptic feedback that the piezoelectric switch has been actuated.

According to another aspect, a method of producing a functional leather component comprises providing a leather sheet; applying to a first side of the leather sheet, a flexible electronic circuit including a piezoelectric switch that can be actuated to make or break a conductive path in the circuit; and arranging a pigmented coating over the circuit. When the switch is actuated to make or break the conductive path in the circuit, the piezoelectric switch provides haptic feedback that the piezoelectric switch has been actuated.

According to another aspect, a functional vehicle component comprises a vehicle component covered by a functional leather assembly. The functional leather assembly includes a leather sheet covering the vehicle component; and a flexible electronic circuit arranged on an outermost surface of the leather sheet that faces away from the vehicle component. The flexible electronic circuit includes a piezoelectric switch that can be actuated to make or break a conductive path in the circuit. Upon actuation of the piezoelectric switch to make or break the conductive path in the circuit, the piezoelectric switch provides a haptic signal that indicates the actuation of the piezoelectric switch.

According to another aspect, a functional vehicle component comprises a vehicle component covered by a functional leather assembly. The functional leather assembly includes a leather sheet covering the vehicle component; a flexible electronic circuit arranged on an outermost surface of the leather sheet that faces away from the vehicle component; and a pigmented coating arranged over the circuit. The flexible electronic circuit includes a piezoelectric switch that can be actuated to make or break a conductive path in the circuit. Upon actuation of the piezoelectric switch to make or break the conductive path in the circuit, the piezoelectric switch provides a haptic signal that indicates the actuation of the piezoelectric switch.

According to another aspect, a method of producing a functional vehicle component, comprises applying to a first surface of a leather sheet, a flexible electronic circuit including a piezoelectric switch that is actuatable to make or break a conductive path in the circuit; arranging a pigmented coating over the first surface of the leather sheet and over the flexible electronic circuit including the piezoelectric switch; fixing the leather sheet over a surface of a vehicle component such that the first surface of the leather sheet is facing away from the vehicle component to thereby define an outermost surface of the leather sheet; and connecting the circuit to a vehicle electronic control unit and a vehicle power source. Upon actuation of the piezoelectric switch to make or break the conductive path in the circuit, the piezoelectric switch provides a haptic signal that indicates the actuation of the piezoelectric switch. Optionally, the pigmented coating inhibits or prevents the circuit including the piezoelectric switch from being visible through the pigmented coating.

According to another aspect, a method of producing a functional vehicle component, comprises applying to a first surface of a leather sheet, a flexible electronic circuit including a piezoelectric switch that is actuatable to make or break a conductive path in the circuit; fixing the leather sheet over a surface of a vehicle component such that the first surface of the leather sheet is facing away from the vehicle component to thereby define an outermost surface of the leather sheet; and connecting the circuit to a vehicle electronic control unit and a vehicle power source. Upon actuation of the piezoelectric switch to make or break the conductive path in the circuit, the piezoelectric switch provides a haptic signal that indicates the actuation of the piezoelectric switch.

DETAILED DESCRIPTION

In the era of smart phones and research toward autonomous vehicles, there is a need for creating smart functional interior vehicle components having real-time bio feedback loops and dynamic surfaces. Smart functional vehicle components can be used to make a driver's and passenger's driving experience more comfortable and enjoyable as compared to non-functional vehicle components.

The present subject matter provides a smart functional layered assembly that is flexible and therefore can be wrapped over various vehicle components to make the vehicle components smart and functional. The layered assembly can be arranged on an interior or exterior of a vehicle. The surface of the layered assembly presents a smooth and clean finish, and therefore has an uncluttered appearance despite having a smart functional capacity.

The present subject matter includes a substrate, for example a natural substrate such as leather, textiles, etc., and includes making the substrate conductive, smart, and functional without cluttering the appearance of the substrate by including visible buttons, sensors, or other functional or smart elements on an A-surface of the substrate. The present subject matter will provide a dynamic interior experience for occupants of a vehicle, yet provide a functional vehicle component that has an uncluttered appearance.

Figure 1:
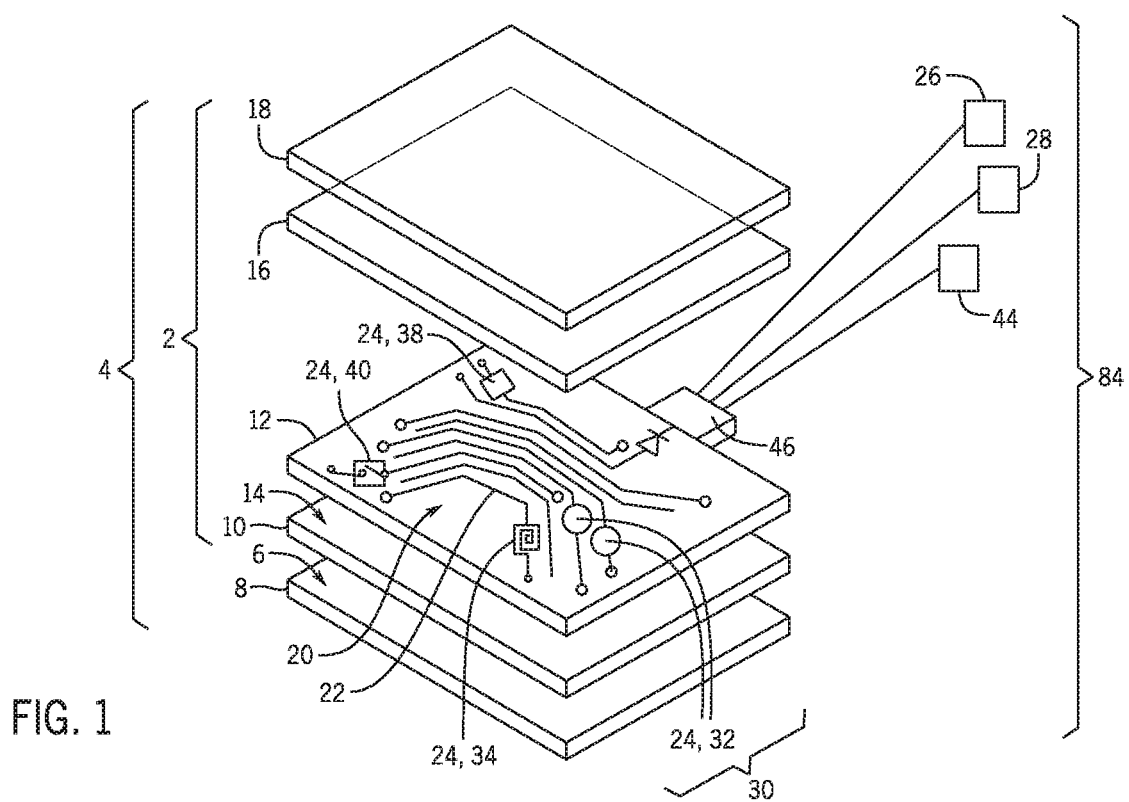
FIG. 1 is a partially exploded schematic view of a portion of a smart functional vehicle component in accordance with the present subject matter.

Referring now to the figures, wherein the showings are for purposes of illustrating one or more embodiments only and not for purposes of limiting the same, FIG. 1 depicts a smart functional vehicle component 2 (also referred to herein as "functional vehicle component 2" including a smart functional layered assembly 4 (also referred to herein as a "layered assembly" or as a "functional leather assembly") arranged on a vehicle component 8.

The smart functional layered assembly 4 includes a leather sheet 10 fixed over the surface 6 of the vehicle component 8, a flexible electronic circuit layer 12 (also referred to herein as "circuit layer 12") applied to an A-surface 14 of the leather sheet 10, and a pigmented coating 16 over the circuit layer 12. As used herein, "A-surface" refers to the outermost surface of the leather sheet 10 that is most visible (i.e. facing) to the vehicle occupants after the functional vehicle component 2 including the leather sheet 10 is assembled and arranged in/on a vehicle; while a B-surface, a C-surface, a D-surface, etc. are other surfaces of the leather sheet that are progressively less visible than the A-surface 14. On a functional vehicle component 2 in an interior of a vehicle, the A-surface 14 of the leather sheet 10 is facing the vehicle occupants and unless covered by another layer or feature, may be visible to the occupants of the vehicle. The A-surface 14 may be what is referred to in the leather industry as the grain side, the skin side, the top side, or the hair side of the leather sheet 10. The grain side, the skin side, the top side, or the hair side is the side of the leather sheet 10 opposite from what is referred to in the leather industry as the flesh side or back side of the leather sheet 10. The flesh side is the side of the leather sheet 10 that is connected to the meat of the animal from which the leather sheet 10 is taken. The functional layered assembly 4 optionally includes an anti-soiling component layer 18. However, in an alternative embodiment, the functional layered assembly 4 may not include a separate and distinct anti-soiling component layer 18, and instead can include an anti-soiling component as part of the pigmented coating 16.

The vehicle component 8 is not particularly limited by the present subject matter, and may include any interior vehicle component such as an interior panel, a door, a seat, a steering wheel, an arm rest, a dashboard, a center console, a gear shifter or any other interior component that can be wrapped with leather. Optionally, the vehicle component 8 can include an exterior vehicle component. The vehicle component 8 is different from the smart functional vehicle component 2, in that the vehicle component 8 does not include the smart functional layered assembly 4 applied over its surface 6. In one non-limiting embodiment, the vehicle component 8, before assembling with the functional layered assembly 4, does not include any smart or functional elements or features such as sensors, processors, circuits, switches, or the like. However, it will be understood that the vehicle component may include smart or functional elements aside from those included on the smart functional layered assembly 4.

The surface 6 of the vehicle component 8 may be smooth or textured, and flat or contoured. In one non-limiting example, the A-surface 6 of the vehicle component 8 is contoured. In any event, the functional layered assembly 4 is fixed over the surface 6 of a vehicle component 8 in order to make the vehicle component 8 smart and functional.

The leather sheet 10 may be fixed over the surface 6 of the vehicle component 8 in order to enhance the aesthetics of the vehicle component. The leather sheet 10 may be naturally flexible, pliable, and stretchable, and therefore can be wrapped around or over the vehicle component 8 and conforms to the contours of the surface 6 of the vehicle component 8. Because the circuit layer 12 and circuits 20 are flexible and are applied to the A-surface 14 of the leather sheet 10, the circuit layer 12 and circuits 20 are also conformed to the contours of the surface 6 of the vehicle component 8. The leather sheet 10 may be in direct contact with the surface 6 of the vehicle component 8, or may have one or more optional layers therebetween. Optionally, the leather sheet 10 may simply cover or be over the surface 6 of the vehicle component 8.

The leather sheet 10 may be prepared in any number of ways including by regular tanning processes including soaking, sammying, shaving, fleshing/splitting, drying, staking, and milling of natural leather. The leather sheet 10 may be replaced or supplemented with bonded leather, synthetic leather, other leather composite material, or other material or layers as desired. The leather sheet 10 may be cut or formed to a particular size or shape to correspond to the shape and size of the vehicle component 8 to which it will be wrapped. In accordance with the present subject matter, the leather sheet 10 may have a shape and size that is configured to wrap over a surface of an interior panel, a door, a seat, a steering wheel, a dashboard, a center console, or a gear shifter.

Either before or after fixing the leather sheet 10 over the surface 6 of the vehicle component 8, the various other layers (i.e. circuit layer 12, pigmented coating 16, and optional anti-soiling component layer 18) of the functional layered assembly 4 may be applied to the leather sheet 10. In one embodiment, the leather sheet 10 is fixed over the surface 6 of the vehicle component 8 after the various other layers of the functional layered assembly 4 are applied to the leather sheet 10. In another embodiment, the leather sheet 10 is fixed over the surface 6 of the vehicle component 8 before the various other layers of the functional layered assembly 4 are applied to the leather sheet 10.

The leather sheet 10 may be flexible, and therefore in one non-limiting embodiment, may be fixed over the surface 6 of the vehicle component 8 by stretching and wrapping the leather sheet 10 around the vehicle component 8. The leather sheet 10 may be fixed, such as by adhesive or fasteners, to the surface 6 and/or other portion of the vehicle component 8.

In one embodiment, the circuit layer 12, pigmented coating 16, and optional anti-soiling component layer 18, even though they are applied over the A-surface 14 of the leather sheet 10, still allow some characteristics (e.g. surface texture or grain, and softness) of the leather sheet 10 to be at least partially perceived by occupants of the vehicle, such as by touch or sight.

The circuit layer 12 is provided over the A-surface 14 of the leather sheet 10 in order to provide smart functional characteristics to the leather sheet 10. The circuit layer 12 consists of one or more flexible electronic circuits 20 (also referred to herein as "electronic circuits" or "circuits"), and is arranged on the A-surface 14 of the leather sheet 10. Although the circuit layer 12 is depicted in FIG. 1 as being a continuous layer, this is only for convenience in order to show the arrangement of the various layers of the smart functional vehicle component 2, and it will be understood that the circuit layer 12 may or may not comprise voids between conductive traces of the one or more circuits 20, and therefore the circuit layer 12 may or may not be a continuous layer as depicted.

In one embodiment, the circuit layer 12 contacts the A-surface 14 of the leather sheet 10. In another embodiment, the circuit layer 12 is arranged on a polymer film, which is then arranged over the A-surface 14 of the leather sheet 10. The one or more circuits 20 of the circuit layer 12 each include one or more flexible conductive traces 22 (also referred to herein as "conductive traces", "conductive paths" or "traces"). By "flexible", it is meant a layer, circuit, trace or other element or material that is not rigid, brittle, or stiff, and instead bends, stretches, changes shape, or otherwise yields to external forces, yet does not break or lose functionality when subject to such external forces. When referring to a "flexible electronic circuit", it is meant an electronic circuit 20 that does not break and retains its conductivity even when bent, stretched, twisted or otherwise deformed to a strain of 10% to at least 20%.

In one embodiment, the circuit layer 12 includes only one electronic circuit 20. In another embodiment, the circuit layer 12 includes more than one electronic circuit 20, for example, two, three or more electronic circuits 20. When more than one circuit 20 is included in the circuit layer 12, each individual circuit 20 may be configured to perform a different function than the other circuits 20, which may mean that each circuit 20 is electrically isolated/separated from the other circuits 20, or the circuits 20 can be independently operated, or each circuit 20 can function separately from the other circuits 20, or the circuits 20 are electrically connected to different types of electronic elements 24.

The one or more circuits 20 (including one or more conductive traces 22) and the electronic elements 24 may each be formed using an electrically conductive ink that includes a binder (e.g. polymer material such as polyimide) and conductive particles, including for example, copper, silver, carbon, silver chloride, or other electrically conductive particles. The one or more circuits 20 each may be formed by applying, e.g. printing, a conductive ink directly on the A-surface of the leather sheet, followed by curing, drying, hardening, etc. of the conductive ink, to thereby form the conductive traces 22, circuits 20, and electronic elements 24 of the circuit layer 12. In other words, the conductive traces 22, circuits 20, and electronic elements 24 may be defined by or include a printed and cured conductive ink. Conductive inks that are suitable to create the one or more circuits 20 and electronic elements 24 are not particularly limited, and may include for example, PE671, PE773, PE873, and PE971 Stretchable Conductors, PE410 Ink-Jet Silver Conductor, 5021, 5025, 5028, and 5064HY Ag Conductors, ME601 and ME602 Stretchable Silver Conductors, PE827 and PE828 Ultra-Low Temperature Cure Silver Composit Conductors, Kapton™ KA801 Polyimide Silver Conductor, available from E. I. du Pont de Nemours and Company; and CI-1036, CI-4040, CI-2051, and CI-1062 Stretchable Conductive Ink available from Engineered Materials Systems, Inc. (EMS).

These conductive inks can be applied on the surface 14 of the leather sheet 10 by any method including pad-printing, flexography, rotogravure, spraying, dipping, syringe dispensing, stenciling, screen printing, aerosol jet printing, or inkjet printing for example in order to create an electronic circuit. The flexible electronic circuits 20 can be formed using other materials or processes including etching, in-mold forming of the electronic circuits 20, selective photo-curing, and circuit scribe, for example. In one illustrative embodiment, the one or more circuits 20 are formed by screen printing a conductive ink on the surface 14 of the leather sheet 10.

Figure 2:
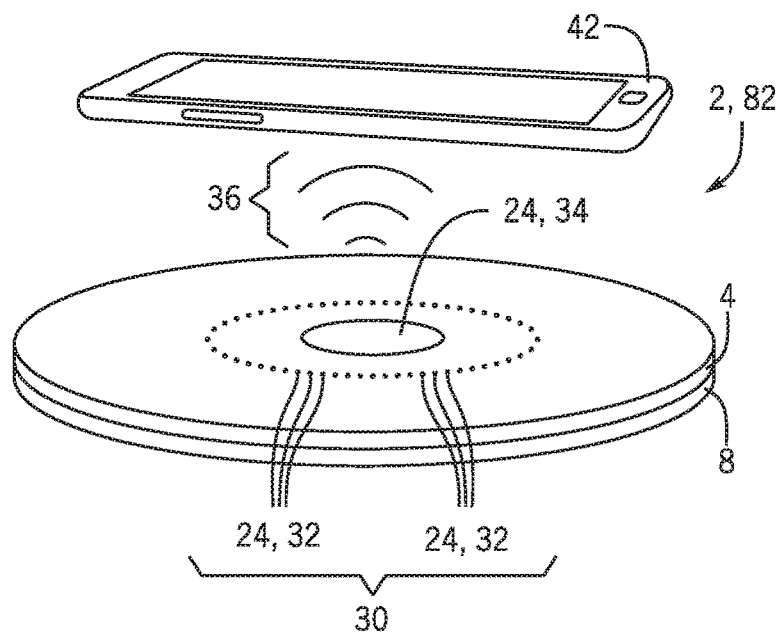
FIG. 2 is a perspective view of a use of a smart functional vehicle component in accordance with the present subject matter.

The one or more circuits 20 can each include electronic elements 24 such as power sources, capacitors, inductors, diodes, resistors, transformers, switches, sensors, loads, light sources, fuses, antennas, wireless transmitters, heaters, etc., each of which may be flexible. However, it will be understood that these or other electronic elements may be included in electrical communication with the circuits 20, but arranged elsewhere other than as part of the circuit layer 12. In one non-limiting example, a light source 30 is included as an electronic element 24 in the functional vehicle component 2. In another non-limiting example and as shown in FIGS. 1 and 2, a wireless transmitter 34 (e.g. an induction coil, or a capacitive plate) is included as an electronic element 24 in the functional vehicle component 2. In a further non-limiting example, one or more sensors 38 are included in an electronic circuit of the circuit layer 12. In still another non-limiting example, a switch 40 is included in an electronic circuit of the circuit layer 12.

The pigmented coating 16 may be arranged over the circuit layer 12 to at least partially conceal or camouflage the circuit layer 12 including the electronic elements 24. The pigmented coating 16 is not particularly limited by the present subject matter, and may include a translucent layer, film, or coating arranged over the flexible circuit layer 12. By "translucent" it is meant a material or layer that allows light to pass therethrough, but causes sufficient diffusion to prevent perception of distinct images through the material or layer. In an embodiment, the pigmented coating 16 is not included, or the pigmented coating 16 is clear (i.e. optically transparent) and/or the circuit layer 12 and electronic components thereof are positioned on top of the pigmented coating 16. In a non-limiting example, the pigmented coating 16 produces sufficient diffusion of light such that visibility through the pigmented coating 16 of the flexible electronic circuit 20 and all the electronic elements 24 of the circuit layer 12, except for light emitted by the light source 30, is inhibited by the pigmented coating 16. In one embodiment, the flexible electronic circuit 20 and all the electronic elements 24 of the circuit layer 12 are not visible through the pigmented coating 16. The light source 30 is also under the pigmented coating 16, and therefore visibility of the light source 30 through the pigmented coating is inhibited by the pigmented coating 16. In one embodiment, the light source 30 is also not visible through the pigmented coating 16. However, the pigmented coating 16 is sufficiently translucent (rather than being opaque) such that light emitted by the light source 30 is visible through the pigmented coating 16. Accordingly, the pigmented coating 16 at least in some measure conceals the flexible circuit layer 12 (including the light source 30) from view, yet allows light emitted from the light source 30 to be transmitted therethrough so that the emitted light is visible through the pigmented coating 16 and can be seen. Light emitted from the light source 30 that is transmitted through the pigmented coating 16 may be seen for example, by a vehicle occupant, and can be used for vehicle illumination or as visual indicators to convey information to a vehicle occupant.

The pigmented coating 16 may be polymer, textile, composite material, enamel, paper, glass, metal, ceramic, other material, and combinations thereof. In one non-limiting example, the pigmented coating 16 comprises a pigmented layer including for example a mixture of polymer and pigment particles. The polymer may be an acrylic urethane resin for example. The pigmented coating 16 may be formed by applying the polymer/pigment mixture as a liquid over the flexible circuit layer 12 and curing the polymer to produce the pigmented coating 16 as a solid. The pigmented coating 16 may have a pigment loading and/or thickness sufficient to inhibit or prevent the circuit 20 and the electronic elements 24 including the light source 30 from being visible through the pigmented coating 16. However, the pigmented coating 16 is sufficiently translucent, as opposed to being opaque, such that light emitted by the light source 30 can be seen through the pigmented coating 16. In one non-limiting embodiment, the pigmented coating 16 has a thickness from 5-50 µm, 15-40 µm, or 20-30 µm.

The anti-soiling component layer 18 or an anti-soiling component included in the pigmented coating 16, may present an exposed surface of the functional vehicle component 2, and these are optionally included to resist any type of dirt while maintaining all physical and aesthetical properties of the underlying layers of the functional layered assembly 4. The anti-soiling component layer 18 is not particularly limited by the present subject matter, and may include an anti-soiling component included as a distinct layer as depicted in FIG. 1. Alternatively, an anti-soiling component may be included as part of the pigmented coating 16. In a non-limiting embodiment as depicted in FIG. 1, when included as a distinct layer in the functional layered assembly 4, the anti-soiling component layer 18 is essentially transparent (and may be optically transparent) such that the anti-soiling component layer 18 does not significantly interfere with the transmission of light emitted by the light source 30. In another embodiment, the anti-soiling component layer 18 may be slightly pigmented such that it assists the pigmented coating 16 in concealing the circuit layer 12 from view. In one non-limiting embodiment, the anti-soiling component layer 18 has a thickness from 0.1-10 µm, 1-8 µm, or 4-6 µm.

The anti-soiling component included in an anti-soiling component layer 18 or in the pigmented coating 16, is not particularly limited and may comprise acrylic urethane resin, polyurethane resin, polyisocyanate, carbodiimide, fluorine-containing materials such as tetrafluoroethylene (TFE)-copolymers, silicone, etc.

Operation of the functional vehicle component 2, the electronic circuits 20, and the associated electronic elements 24 may correspond to signals or data derived from one or more electronic systems of a vehicle or may be continuously activated during operation of the vehicle. The data or signals may be accessed from, sensed by, generated by, or otherwise acquired from or produced by one or more of the vehicle electronic systems. Further, the functional vehicle component 2, the electronic circuits 20, and the associated electronic elements 24 may provide signals or data to the one or more electronic systems of the vehicle. For example and as described in more detail herein, the functional vehicle component 2 may include a sensor 38 and signals from the sensor 38 may be communicated to the vehicle electronic systems, and may be used to operate other electronic elements 24 in the functional vehicle component 2 or to operate a different functional vehicle component.

The vehicle electronic systems from which this data or these signals are derived or to which this data or these signals are communicated, are not particularly limited and may include one or more vehicle electronic control units (ECU's) associated with a vehicle engine, transmission, body, chassis, passive and active safety features, vehicle performance, driver assistance, interior and exterior environment, vehicle diagnostics, vehicle control, audio/visual entertainment, navigation, electrical systems, telematics, and combinations thereof. The vehicle electronic systems can include a door control unit, engine control unit, electric power steering control unit, human-machine interface (HMI), powertrain control module, transmission control unit; seat control unit, speed control unit, telematics control unit, transmission control unit, brake control module (ABS or ESC), battery management system, central control module, central timing module, general electronic module, body control module, suspension control module, or combinations thereof.

In a non-limiting example, the one or more flexible electronic circuits 20 are in communication with a vehicle electronic control unit (ECU) 26, which may control operation of the functional vehicle component 2, the electronic circuits 20, and the associated electronic elements 24. The ECU 26 may be electrically connected to a vehicle power source 44 for powering the ECU 26 or flexible electronic circuits 20. The functional vehicle component 2, including the one or more circuits 20 of the circuit layer 12, along with the various electronic elements 24, may be selectively operable based on a current condition or situation relating to the vehicle or vehicle components, an occupant of the vehicle, or an environment of the vehicle including an immediate or a distant surrounding environment of the vehicle, and combinations thereof.

A non-limiting example of the conditions of the vehicle that may be used as a basis for such selective operation include historical, current, or projected vehicle performance characteristics or diagnostic information, or the like. Conditions of the vehicle occupants that may be used as a basis for such selective operation can include a physical condition of a driver, such as the driver being drowsy or inattentive while driving, or the proximity of an object (such as an occupant or an occupants hand) or a global position relative to the vehicle or to the functional vehicle component 2. Conditions of the surrounding environment that may be used as a basis for such selective operation can include proximity of an object (such as another vehicle) to the vehicle, the current time, newsfeeds, amber alerts, nearby points of interest, or the like.

In another non-limiting example, the one or more circuits 20 are in communication with a human machine interface (HMI) 28, which may control functioning of the functional vehicle component 2, the electronic circuits 20, and the associated electronic elements 24. Such arrangement could allow a user to provide input through the HMI 28 to selectively activate the circuits 20 and associated electronic elements 24. Such user input may be active (user initiated) or passive (sensed input from a user), and can include audible or tactile input. For example, the system may be configured to allow a user to audibly select operation of the functional vehicle component 2, the electronic circuits 20, and the associated electronic elements 24.

As previously disclosed, a light source 30 may be included as an electronic element 24 in the functional vehicle component 2. The light source 30 may comprise one or more separate and distinct light emitter elements 32. The light source 30 emits light when activated, and is electrically connected to an electronic circuit 20 of the circuit layer 12. The light source 30 may simply provide illumination by emitting light, which may be used to provide illumination to the interior or exterior of the vehicle, and the light source 30 may emit light in one or more colors and/or intensities. In a non-limiting example, the light source 30 may emit various colors and intensities of light to establish a particular "feel" or "mood" for occupants of the vehicle. For example, the light source 30 may be paired to certain functions of the vehicle or vehicle components, such that the light source 30 operates to emit light at different intensities and/or colors depending on certain circumstances such as during normal operation of the vehicle, during operation of a vehicle entertainment system, during dangerous operation of the vehicle, or other circumstances or situations as desired.

Alternatively, the light source 30 may be configured, such as by arrangement or operation, to emit light that provides visual indicators that convey information to a vehicle occupant. In other words, the light source 30 may be arranged in such a way, or may emit light in such a way that the light emitted by the light source 30 provides more than mere illumination, and instead additionally conveys information to a vehicle occupant.

The visual indicators are not particularly limited by the present disclosure, and may provide information such as warnings, notices (e.g. the time), alerts, instructions, information relating to a current condition or situation relating to the vehicle or vehicle components, an occupant of the vehicle, or an environment of the vehicle including an immediate surrounding environment of the vehicle, and combinations thereof. The visual indicators may include one or more of directional indicators such as turn-by-turn directions from a navigation system, blind spot warnings, a turn signal indicator, and combinations thereof. However, such indicators are not limited to any particular type or combination. Other illustrative examples include maintenance indicators to display information such as fluid levels/amounts such as oil or gas (or the need to change one or more fluids such as oil), battery level indicators to display characteristics of one or more batteries on the vehicle, vehicle characteristic indicators (e.g. the current speed of the vehicle), and indicators to display the distance to a desired driving destination. In one illustrative embodiment, the light emitted by the light source 30 indicates a location of the one or more electronic circuits 20 or electronic elements 24 electrically connected to the electronic circuits 20 of the circuit layer 12. In another illustrative embodiment, the light source 30 emits light that provides a directional indicator to a driver of the vehicle, or a current time, or a current amount of fuel reserves for the vehicle.

The light source 30 may be activated to emit light when a certain associated object is within a predetermined distance from the functional vehicle component 2. In one embodiment, the light source 30 is activated to emit light when a portable electronic device 42 is within a predetermined distance from the functional vehicle component 2. In another embodiment, the functional vehicle component 2 is in communication with an HMI 28, which could allow a user to provide input to activate the light source 30 by selecting a particular type of information to be displayed by the light source 30. For example, the system may be configured to allow a user to audibly select which fluid level (such as gas, oil, windshield wiper) to indicate in real-time or to allow a user to audibly request how much time until a desired destination is reached.

The visual indicators may correspond to signals or data derived from the electronic systems of a vehicle or an HMI. In one embodiment, electronic system of the vehicle provide real-time signals or data that may be displayed by the light source 30. Communication between the functional vehicle component 2 and the vehicle electronic system or HMI may be established through one or more intermediary systems or devices, and such communication may be performed, for example, by using a communication link or connection such as with a wired connection, Wi-Fi connection, Bluetooth connection, etc. Such communication connection allows the data or signals from/to the vehicle electronic system or HMI to be communicated to activate the light source 30 to provide the visual indicators to a vehicle occupant that corresponds to such data or signals.

The light source 30 is not limited in any way and can include luminescent light sources (e.g. electroluminescent, photoluminescent, mechanoluminescent light sources), and incandescent light sources. Illustrative examples of light emitter element 32 include a light emitting diode (LED), an organic light emitting diode (OLED), or a photoluminescent or electroluminescent light source configured in a film or sheet. In a non-limiting example, the one or more light emitter elements 32 comprises LED's having a light emitting area with a size of 100 μm×100 μm (i.e. 100 μm diameter) or less, herein referred to micro LED's. A micro LED is a light source that consists of an array of one or more individual light emitters, wherein an array may have a diameter of about 2 μm-20 mm and the individual light emitters have typical diameters of about 2-20 μm. In one aspect, the one or more micro LED's are arranged as part of an electronic circuit 20 of the circuit layer 12.

As previously discussed, and as depicted in FIG. 2, the functional vehicle component 2 may comprise a smart functional wireless charger 82 including a wireless transmitter 34 (e.g. an induction coil, or a capacitive plate), which is included as an electronic element 24 in the functional vehicle component 2. The wireless transmitter 34, may optionally be formed by printing a conductive ink in a process as described herein with respect to the flexible circuits 20, wherein the conductive ink is applied in the form of an induction coil or capacitive plate. The wireless transmitter 34 may be configured to generate an oscillating electromagnetic field 36 when activated, which can be transmitted to a corresponding wireless receiver that is configured to receive the oscillating electromagnetic field. The wireless transmitter 34 and the generated oscillating electromagnetic field 36 may be used to charge a portable electronic device 42 (e.g. a cell phone) that includes the corresponding wireless receiver, which receives the oscillating electromagnetic field 36 and converts the oscillating electromagnetic field 36 back to DC or AC electric current that can be used by an electrical load in the portable electronic device 42.

As is conventional, the wireless transmitter 34 may be able to transmit the oscillating electromagnetic field 36 to the corresponding wireless receiver in the portable electronic device 42 only over a short distance, e.g. about 1-10 times the transmitter 34 or receiver diameters. Therefore, in one embodiment, the wireless transmitter 34 is configured to operate to generate the oscillating electromagnetic field 36 only when the portable electronic device 42 or the associated wireless receiver is within a predetermined distance, e.g. about 1-10 times the transmitter 34 or receiver diameters, from the wireless transmitter 34. Such activation may be based on signals or data from a proximity sensor or other device included in the circuit layer 12 or elsewhere that can sense the proximity of the portable electronic device 42 with respect to the functional vehicle component 2. Alternatively, activation of the wireless transmitter 34 may be based on communication (e.g. blue tooth, cellular, near-field, RFID, Wi-Fi, or infrared communication) between the portable electronic device 42 and the functional vehicle component 2.

As depicted in FIG. 2, the smart functional wireless charger 82 may include a light source 30 comprising a plurality of individual light emitter elements 32 that are arranged, for example, in a ring around the wireless transmitter 34. In this ring or any other configuration, the individual light emitter elements 32 each emit light that collectively indicates a location of the wireless transmitter 34 on the functional vehicle component 2. Such indication is useful, since the pigmented coating 16 may optionally conceal the wireless transmitter 34 and other portions of the circuit 20 from being visible through the pigmented coating 16, and a user therefore may not be able to locate the wireless transmitter 34 for charging the portable electronic device 42. However, light emitted by the light emitter elements 32 can be seen through the pigmented coating 16, and therefore the emitted light may provide an indication of the location of the wireless transmitter 34 to allow for wireless charging of the portable electronic device 42. In one aspect, the color of light emitted by the light emitter elements 32 changes from an initial color (for example, red light) present at the onset of charging the portable electronic device 42, to a second color (for example, green light) when the portable electronic device 42 is fully charged. Other lighting capabilities are contemplated for this embodiment, for example, the light source 30 may be activated to emit light when a door of the vehicle is opened, when the vehicle is started, and/or when a portable electronic device 42 is moved within a predetermined distance from the wireless transmitter 34. With respect to the color of light emitted by the light source 30, different colors may be provided based on the selection of light emitter elements 32 for use in the light source 30, based on the use of different lighting circuits, and/or based on programming of the microcontroller 46 to control functioning of the light source 30 as desired. The functional layered assembly 4 depicted in FIG. 2 may be included on any vehicle component 8 as desired, for example on any interior surface of a vehicle such as a vehicle seat, dashboard, or center console.

As described herein, one or more sensors 38 may be included in an electronic circuit 20 of the circuit layer 12. The sensors 38 are not particularly limited, and can include a sensor having any configuration including those that can sense pressure, temperature, proximity, location, speed, velocity, acceleration, tilt, motion, humidity, light, biometrics of a vehicle occupant, etc. In one embodiment, the circuit layer 12 includes one or more pressure sensors. The pressure sensor may include a first flexible layer of conductive material, a second flexible layer of dielectric material, and a third flexible layer of conductive material, where the second dielectric layer is arranged between and separates the first and third conductive layers. The first and third conductive layers of the pressure sensor may optionally be formed by applying a conductive ink as described herein, while the second dielectric layer may be formed by applying a dielectric material, for example an ink that is similar to the conductive ink as described herein, but one that has dielectric properties.

As described herein, a switch 40 may be included in an electronic circuit 20 of the circuit layer 12. The switch 40 may be operable to make or break a conductive path in the circuit 20. The switch 40 may be a parallel plate capacitive switch for example, or other type of switch as desired such as a membrane switch, or a piezoelectric switch. A parallel plate capacitive switch or piezoelectric switch may be arranged similar to the pressure sensor as previously described herein, wherein the capacitive switch or piezoelectric switch may include a first or bottom flexible layer of conductive material (e.g. ink) printed in electrical communication with first conductive trace, followed by a sequentially printed second middle layer arranged over the bottom conductive layer, and finally a third top flexible layer of conductive material printed over the middle layer and in electrical communication with a second conductive trace. For the capacitive switch, the middle layer may include a flexible printed layer of dielectric material (e.g. a dielectric ink). For the piezoelectric switch, the middle layer may include a piezoelectric material, which may or may not be printed and cured. The piezoelectric switch may include other layers and components.

The bottom layer of the switch is cured before applying the middle layer, and if printed, the middle layer is cured before printing the top layer. That is, the bottom, middle, and top layers of the switch 40 have overlapping areas, and the second middle layer is arranged between and thus separates the first and third conductive layers.

The dielectric middle layer in the dielectric switch may include one or more sub-layers (e.g. two sub-layers) of the same or different dielectric material printed and cured over the bottom layer. The piezoelectric middle layer in the piezoelectric switch may include one or more sub-layers (e.g. two or more sublayers) of piezoelectric material, which also may be sequentially printed and cured over the bottom layer. The conductive top and bottom layers may each include one or more sub-layers (e.g. two sub-layers) of the same or different conductive ink printed and cured below and above the middle layer. Thickness of the first, second, and third layers is not particularly limited, and in one non-limiting example of the dielectric switch, the thickness may range from about 100 nm to 10 µm. The first and third conductive layers of the switch may optionally be formed by printing a conductive ink as described herein with respect to the flexible circuits 20, while the second dielectric layer of the dielectric switch may be formed by printing a similar, but dielectric ink. In this configuration, the capacitive switch may be used as a pressure sensor when electrical contact is made between the first and third conductive layers by pressing the first and third conductive layers together. Further, the capacitive switch may be used to measure biometric characteristics of a vehicle occupant in contact with the functional vehicle component 2, wherein for example, a rate at which electrical contact is made between the first and third conductive layers may be used to determine a heartrate of the occupant.

The piezoelectric switch is not particularly limited, and the piezoelectric material in the middle layer may include crystal piezoelectric material, ceramic piezoelectric material, polymer piezoelectric material, Group III-V and II-VI semiconductors, organic nanostructures, natural materials, bone, and combinations thereof. The piezoelectric material may include for example, lead zirconate titanate, barium titanate, quartz, berlinite, sucrose, Rochelle salt, topaz, tourmaline-group minerals, lead titanate, potassium niobate, sodium tungstate, zinc oxide (wurtzite structure), $Ba_2NaNb_5O_5$, $Pb_2KNb_5O_{15}$, sodium potassium niobate, bismuth ferrite, sodium niobate, barium titanate, bismuth titanate, sodium bismuth titanate, polyvinylidene fluoride, vinylidene fluoride-trifluoroethylene-chlorotrifluoroethylene terpolymer, P(VDF-TrFE-CTFE), vinylidene fluoride-trifluoroethylene-chlorofluoroethylene terpolymer, P(VDF-TrFE-CFE), or combinations thereof.

In one embodiment, the piezoelectric layer of the piezoelectric switch includes a piezoelectric polymer, e.g. P(VDF-TrFE-CTFE) or P(VDF-TrFE-CFE), and is printed an cured between the bottom layer and the top layer of the switch 40. The piezoelectric switch is actuatable to make or break a conductive path in the conductive trace 22 of the circuit 20. The piezoelectric switch may be actuatable to make or break the conductive path by a user/occupant pressing the piezoelectric switch, thereby deforming/compressing the piezoelectric layer between the bottom and top layer of the switch 40, and thus causing the piezoelectric material to generate a charge. Such charge may be sent to a flip-flop device in the switch 40, which is turned to steady "on" state, thus allowing current to pass therethrough and making the conductive path in the circuit 20. A further deformation/compression of the piezoelectric material will create an additional charge, which will cause the flip-flop device in the switch 40 to turn to a steady "off" stated, thus not allowing current to pass therethrough and breaking the conductive path in the circuit 20. Alternatively, the generated current from the piezoelectric switch may utilize a semiconductor device such as a field effect transistor (FET), which provides a temporary "on" state, but reverts back to a steady "off" state when the charge dissipates.

The piezoelectric switch may be connected to a power source 44 of the vehicle, which can provide an electric charge to the piezoelectric switch when the piezoelectric switch is actuated by a user pressing the switch 40. The electric charge provided to the piezoelectric switch can cause deformations of the piezoelectric layer. Such deformations may be haptically sensed by a user when the user presses the switch 40 to actuate it. Such deformations may be felt as haptic vibrations having various frequencies and/or amplitudes. Such vibrations may be characterized as haptic signals that provide haptic feedback to the user that the piezoelectric switch has been actuated to make or break the conductive path in the circuit 20.

The functional layered assembly 4 can include various other layers or components as desired. In one embodiment and although not shown in the figures, the functional layered assembly 4 includes a dielectric layer over or between one or more circuits 20 or conductive traces 22 of the circuit layer 12. The dielectric material may generally include a non-conductive resin cured to form a dielectric layer. In one embodiment, a dielectric layer is arranged between the circuit layer 12 and the pigmented coating 16 in order to avoid moisture exposure during formation of the pigmented coating 16, or to make the circuit layer 12 more durable and resistant to abrasion and therefore maintain electrical conductivity after repeated use. A dielectric layer or coating may also be used as an insulator, for example, to provide electrical insulation between a first trace or circuit and an overlying second trace or circuit. The dielectric layer may cover only the trace or circuit, or may also generally cover other portions of the circuit layer 12 or leather sheet 10. That is, the dielectric layer may be generally applied over the first circuit as one continuous layer wherein the conductive traces of the first circuit and spaces therebetween are covered by the dielectric layer, or may be applied as a discontinuous layer that covers only the conductive traces of the first circuit, but not the spaces therebetween. In one non-limiting example, the dielectric layer is applied only at a location where a second trace or circuit overlaps the first trace or circuit. In this regard, the circuit layer 12 may include a plurality of separate and distinct traces 22 and/or circuits 20 that may be arranged in different planes or sub-layers of the circuit layer 12, wherein various conductive traces 22 may overlap each other. For example, with reference to FIGS. 1 and 2, although the traces 22 are depicted as not overlapping (and appear to be in the same plane or sub-layer), the traces 22 may be in different planes within the circuit layer 12 and be configured to overlap each other. As such, the circuit layer 12 may include a first trace printed on the leather sheet 10, followed by a dielectric layer applied over the first trace, and then a second trace printed on the leather sheet 10 and at least partially overlapping the first trace, yet because of the intermediary dielectric layer, the first and second trace are electrically isolated form one another. As such, the present subject matter is not limited to any particular shape or orientation of the traces 22, circuits 20 and electronic elements 24 as depicted in the various figures, and instead can have other arrangements and orientations. In another example, a conductive ink is first printed directly on the leather sheet 10 in order to form a wireless transmitter 34, a dielectric layer is then arranged over the wireless transmitter 34, then a conductive ink is printed over the dielectric layer (or overlaps a portion of it) in order to form a separate conductive trace for a different electronic element 24 (such as for a light emitter element 32), and then optionally another dielectric layer is printed over the light emitter trace to provide abrasion resistance for the underlying layers. In this example, the dielectric layer between the wireless transmitter 34 and the light emitter trace electrically isolate the wireless transmitter 34 from the light emitter trace.

In another embodiment, the functional layered assembly 4 includes a microcontroller 46 electrically connected to the circuit layer 12 at an edge of the leather sheet 10. The microcontroller 46 may be used to electrically connect to the circuits 20 of the circuit layer 12, and thus may provide communication to and from the one or more circuits 20 and electronic elements 24, or to control functions of the one or more circuits 20 and electronic elements 24. The microcontroller 46 may be mounted at the edge of the leather sheet 10 and functional layered assembly 4 before or after the functional layered assembly 4 is fixed over the surface 6 of the vehicle component 8. The various vehicle electronic systems, such as an ECU 26 or HMI 28, may be electrically connected to functional layered assembly 4 through the microcontroller 46 in order to communicate with the functional layered assembly 4.

The one or more circuits 20 and the electronic elements 24 may each be electrically connected to a power source 44 of the vehicle for providing electrical power to the circuits 20 for activating the electronic elements 24. The vehicle power source 44 may comprise a vehicle battery, engine, or alternator, for example. The power source 44 may be connected to the functional layered assembly 4 through the microcontroller 46. In one embodiment, a smart functional vehicle system 84 includes a smart functional vehicle component 2, along with one or more of the microcontroller 46, ECU 26, HMI 28, and vehicle power source 44.

Figure 3:
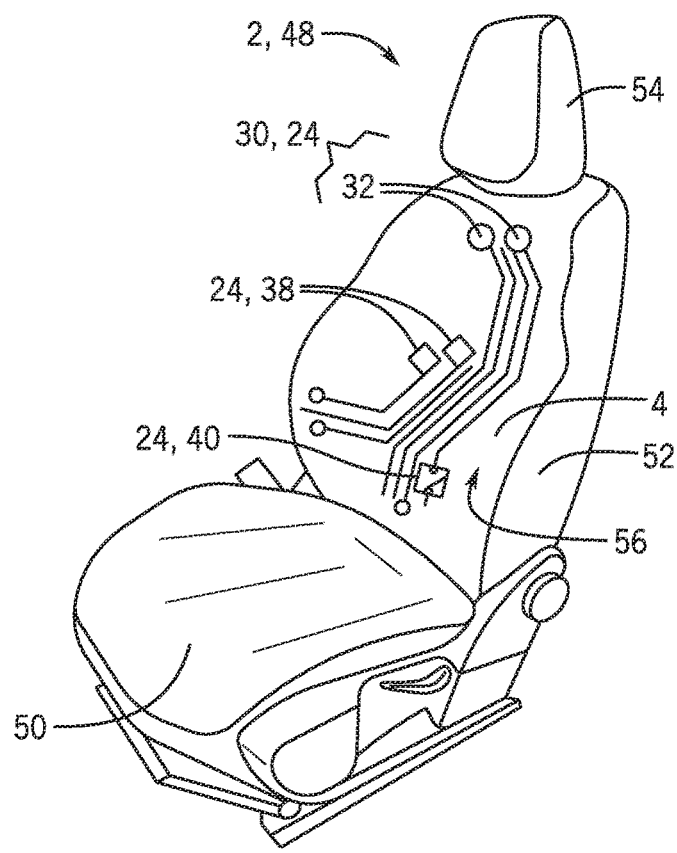
FIG. 3 is a perspective view of another smart functional vehicle component in accordance with the present subject matter.

With reference to FIG. 3, an illustrative example of a smart functional vehicle component 2 includes a smart functional vehicle seat 48 (also referred to herein as "vehicle seat" or "seat"). The seat 48 includes a bottom 50, a back 52, and a headrest 54. The vehicle seat 48 includes a functional layered assembly 4 over the front surface 56 of the back 52 of the seat 48. It will be appreciated that although visibility of the circuit 20 in the functional layered assembly 4 may be inhibited or prevented by pigmented coating 16, the circuit 20 is schematically depicted in FIG. 3 in order to indicate it's arrangement on the vehicle seat 48. As in other embodiments, the functional layered assembly 4 of the vehicle seat 48 may include one or more electronic elements 24. As depicted, the functional layered assembly 4 of the seat 48 includes a light source 30 including two individual light emitter elements 32, and two sensors 38. More or less, and different electronic elements 24 may be included as desired on the seat 48. The sensors 38 may be configured to sense biometrics, such as heart rate, body temperature, blood pressure, etc., of a vehicle occupant who is sitting on the seat 48. The light source 30 may be configured to activate when a vehicle door is open to provide illumination to the seat 48, or during operation of the vehicle in order to provide mood lighting in a passenger compartment of the vehicle. Further, a switch 40, for example a piezoelectric switch, may be provided to manually turn the light source 30 on or off or to produce other functions. More or less, and different electrical elements 24 may be included on the seat 48, and at different locations on the seat 48, including on the bottom 50, the headrest 54, or an armrest (not shown).

Figure 4:
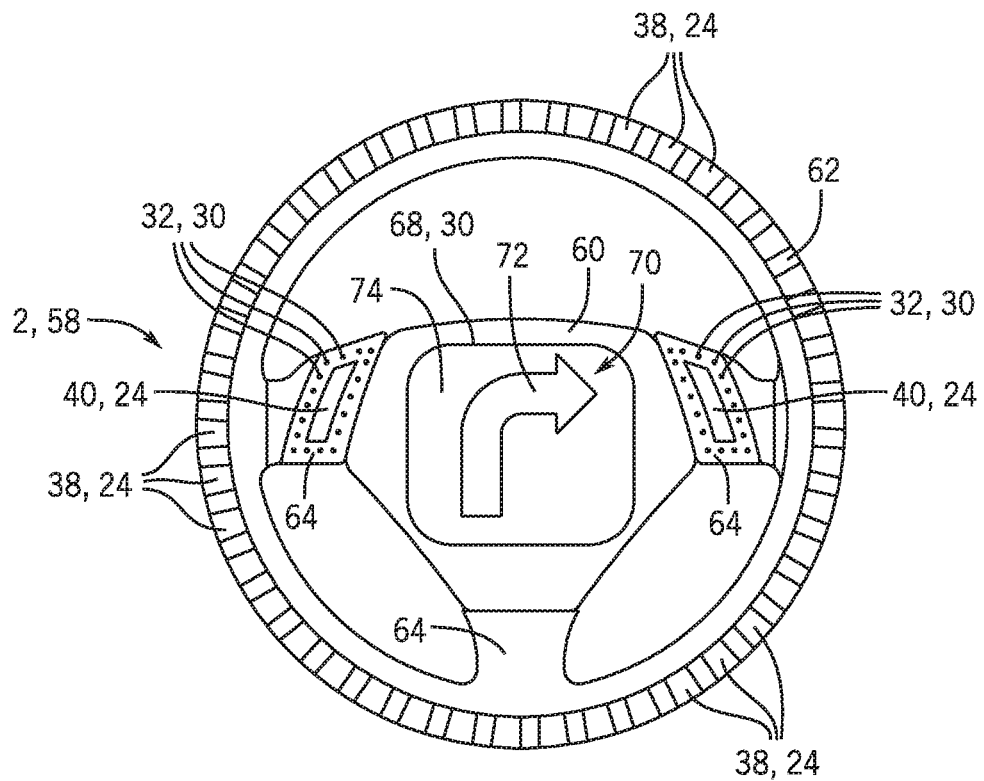
FIG. 4 is a front view of another smart functional vehicle component in accordance with the present subject matter.

With reference to FIG. 4, an illustrative example of a smart functional vehicle component 2 includes a smart functional steering wheel 58 (also referred to herein as "steering wheel"). The steering wheel 58 includes a central hub 60, an outer wheel 62, and spokes 64 extending between the hub 60 and wheel 62. A functional layered assembly 4 may be included over one or more of the hub 60, wheel 62 and spokes 64. In one embodiment, the wheel 62 includes one or more sensors 38. The one or more sensors 38 may be pressure sensors for sensing the presence of a user's hand on the wheel 62. The sensors 38 may also be configured to sense biometrics, such as heart rate, body temperature, blood pressure, etc., of a user. It will be appreciated that although visibility of the sensors 38 may be inhibited or prevented by pigmented coating 16 of the functional layered assembly 4, a plurality of sensors 38 are schematically depicted in FIG. 4 in order to indicate their arrangement on the wheel 62. As depicted, the sensors 38 are spaced from one another and are arranged on the exposed portions of the wheel 62 and around the entire circumference of the wheel 62. In a non-limiting example, each of the sensors 38 is circumferentially spaced by no more than two inches from an adjacent sensor 38. In other words, there is no portion of more than two consecutive inches along the entire circumference of the wheel 62 that is without a sensor 38. By this arrangement, anywhere a driver places his/her hands on the wheel 62, there will be a sensor 38 there so that the sensors 38 can collectively sense the presence of a user's hand no matter where the user's hand contacts the wheel 62. The wheel 2 may alternately include one continuous sensor arranged on the exposed portions of the wheel 62 and extending around the entire circumference of the wheel 62.

In another embodiment, the hub 60 includes a light source 30 comprising an array 68 of individual light emitter elements. The light emitter elements, which are not individually depicted in FIG. 4, may be arranged in the array 68 in such a way that light emitted from the array 68 conveys information to a vehicle occupant. As depicted, the array 68 is displaying a visual indicator 70, which may be a directional indicator that is based on information or data derived from a navigation system. The visual indicator 70 is indicating a direction (i.e. right turn) for the vehicle to follow in order to reach a predetermined destination.

As shown, the array 68 covers an area on the surface of the hub 60 and has an illuminated area 72 and a non-illuminated area 74. The right turn visual indicator 70 is presented by a contrast between the illuminated area 72 of the array 68 (light from which is visible through the pigmented coating 16 of the functional layered assembly 4) and the non-illuminated area 74 of the array 68 (which is not visible through the pigmented coating 16). As such, the visual indicator is determined by activation of a specific combination of individual light emitter elements in the array 68. As will be appreciated, a different combination of individual light emitter elements in the array 68 may be activated as desired in order to provide a different arrangement between the illuminated area 72 and the non-illuminated area 74, such that light emitted by the illuminated area 72 may convey other visual indicators and other information, such as other directional indicators, a current speed or time, etc.

In another embodiment, one or more of the spokes 64 of the steering wheel 58 may each include a switch 40, such as a capacitive switch or piezoelectric switch. As schematically depicted, one switch 40 is included on each of two of the spokes 64. It will be appreciated that although visibility of the switches 40 may be inhibited or prevented by the pigmented coating 16 of the functional layered assembly 4, the switches 40 are schematically depicted in FIG. 4 in order to indicate their arrangement on the spokes 64. The switches 40 may be configured to control one or more functions of the vehicle or vehicle systems, e.g. an entertainment system.

As depicted, a light source 30 comprising a plurality of individual light emitter elements 32, are provided on the spokes 64 and are arranged around the perimeter of the two switches 40. In this configuration, the individual light emitter elements 32 each emit light that collectively indicates a location of the switches 40. Such indication is useful, since the pigmented coating 16 may conceal the switches 40 from being readily visible through the pigmented coating 16, and a user may not be able to locate the switches 40 for controlling one or more functions of the vehicle or vehicle systems. However, light emitted by the light emitter elements 32 can be seen through the pigmented coating 16, and therefore the emitted light provides an indication of the location of the switches 40. In a non-limiting example, the light emitter elements 32 may be activated to continuously emit light during operation of the vehicle in order to indicate the location of the switches 40, and may be deactivated when the vehicle is not being operated to thereby present a plain top surface for the spokes 64 of the steering wheel 58. More or less, and different electronic elements 24 may be included as desired on the steering wheel 58.

Figure 5:
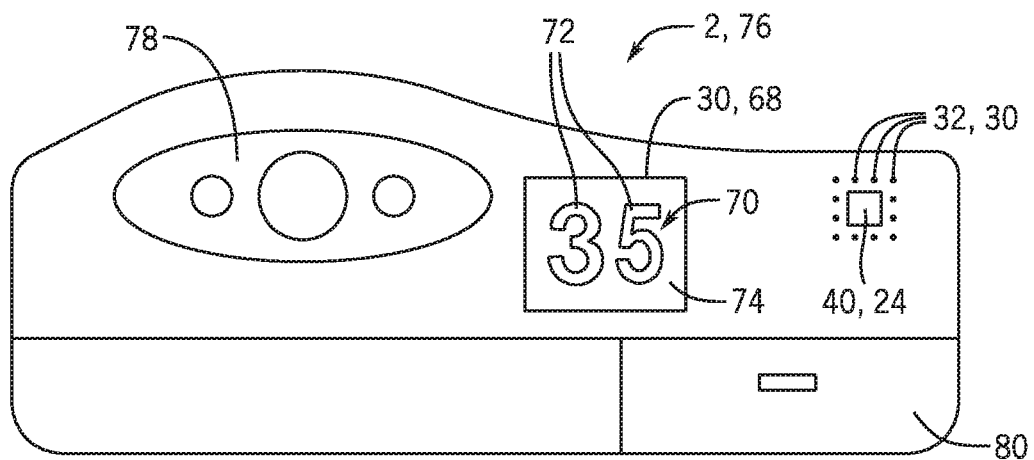
FIG. 5 is a front view of another smart functional vehicle component in accordance with the present subject matter.

With reference to FIG. 5, an illustrative example of a smart functional vehicle component 2 includes a smart functional dashboard 76 (also referred to herein as "dashboard"), which may include an instrument panel 78 and a glove box 80. The dashboard 76 includes a functional layered assembly 4 as discussed herein. The functional layered assembly 4 is fixed over a surface of the dashboard 76 and presents as a plain top surface for the dashboard 76. As depicted, the dashboard 76 includes a light source 30 comprising an array 68 of individual light emitter elements. The array 68 depicted in FIG. 5 may be similar to the array 68 depicted in FIG. 4 on the hub 60 of the steering wheel 58.

As depicted, the array 68 is displaying a visual indicator 70, which may be a current speed of the vehicle. As in FIG. 4, the array 68 covers an area on the surface of the dashboard 76 and has an illuminated area 72 and a non-illuminated area 74. The visual indicator 70 showing the current speed is presented by a contrast between the illuminated area 72 of the array 68 and the non-illuminated area 74 of the array 68. As such, the visual indicator 70 is determined by activation of a specific combination of individual light emitter elements in the array 68. As will be appreciated, a different combination of individual light emitter elements in the array 68 may be activated as desired in order to provide a different arrangement between the illuminated area 72 and the non-illuminated area 74, such that light emitted by the illuminated area 72 may convey other visual indicators and other information, such as a current time, the current amount of fuel reserves for the vehicle, etc. Activation of the array 68 on the dashboard 76 or on the steering wheel 58 may be activated by audible signals from a user. For example, a user may audibly request that the array 68 on the dashboard 76 or on the steering wheel 58 display the current speed, current amount of fuel reserves for the vehicle, distance from a selected destination, etc. More or less, and different electronic elements 24 may be included as desired on the dashboard 76.

Figure 6:
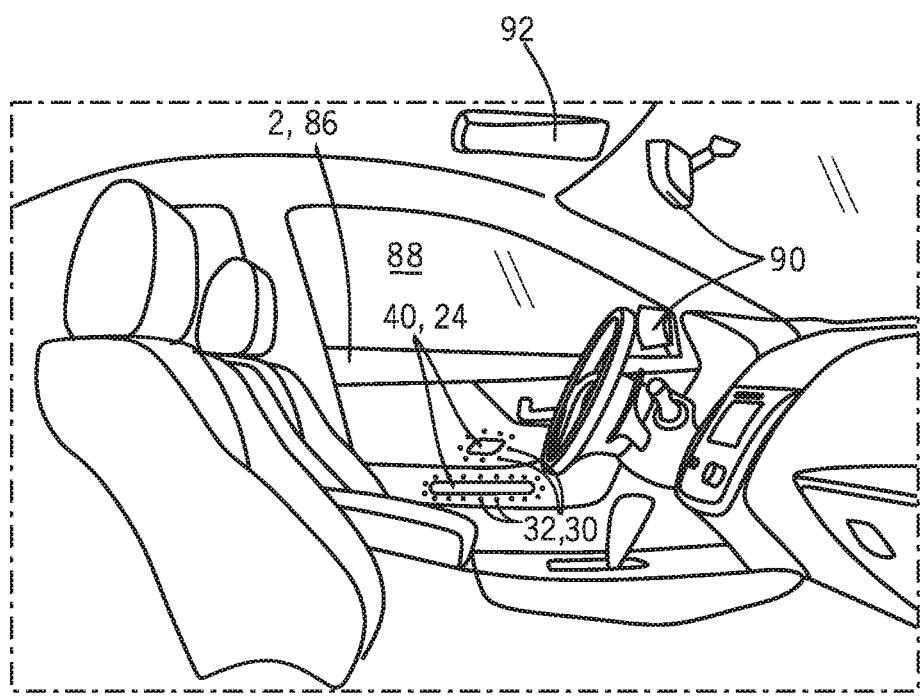
FIG. 6 is a side view of another smart functional vehicle component in accordance with the present subject matter.

With reference to FIG. 6, an illustrative example of a smart functional vehicle component 2 includes a smart functional door panel 86 (also referred to herein as "door panel"). The door panel 86 includes a functional layered assembly 4 as discussed herein. The functional layered assembly 4 is fixed over a surface of the door panel 86 and presents as a plain top surface for the door panel 86. As depicted, the door panel 86 includes. The door panel 86 may include one or more switches 40, such as a capacitive or piezoelectric switch, that are operable to move a window 88, adjust a mirror 90, or operate an interior light 92 of the vehicle. The smart functional door panel 86 may include a light source 30 comprising a plurality of individual light emitter elements 32 that are arranged on the circuit 20 and, for example, in a ring around the switches 40. In this ring configuration, the individual light emitter elements 32 each emit light that collectively indicates a location of the switches 40 on the functional door panel 86. Such indication is useful, since the pigmented coating 16 may conceal the switches 40 and other portions of the circuit 20 from being visible through the pigmented coating 16, and a user therefore may not be able to readily locate the switches 40 for operating the window 88 and mirrors 90. However, light emitted by the light emitter elements 32 can be seen through the pigmented coating 16, and therefore the emitted light may provide an indication of the location of the switches 40 to allow for operation of the switches 40. Further, if the switches 40 are piezoelectric switches, their operation may result in haptic feedback being provide to a user to indicate that the switches 40 have been operated.

The smart functional vehicle component 2 may provide various functionalities in a vehicle including a dynamic illumination experience by providing changing the color of emitted light to the interior of the vehicle according to a vehicle speed, a driving mode, a driver's mood/condition based on biofeedback data, a current music selection. The smart functional vehicle component 2 may also be used to monitor a driver's condition to maintain safe driving using sensors 38 to monitor heart rate, peripheral capillary oxygen saturation, or a driver's health condition, and the data from such monitoring can be used to improve a driver's user experience. Illumination provided by the functional vehicle component 2 can also be utilized to keep a driver attentive by provide real time feedback. When the functional vehicle component 2 is a seat 48, the use of a functional vehicle component 2 can reduce the complexity of the seat because the functional vehicle component 2 can include a number or different electrical elements 24. That is, the functional vehicle component 2 can be utilized as a pressure sensor on the seat, and measure pressure points. This can help to identify driver seat pressure and automatically adjust seat position for driver comfort. This also reduces the need for a separate component of a pressure sensor installed separately on a seat. The functional vehicle component 2 can also be used to give opportunities to create innovative vehicle styling, such as creating navigation directional indicators (FIG. 4) on a steering wheel 58, or a vehicle speed displayed on an interior panel (FIG. 5). The functional vehicle component 2 can also be utilized as a wireless charging pad (FIG. 2) for charging a portable electronic device 42.

The present subject matter includes a method of producing a functional layered assembly 4. The functional layered assembly 4 may be produced by passing a hide through conventional processes such as soaking, sammying, shaving, fleshing/splitting, drying, staking, and milling. Then, after application of a base coat, the hide is set aside to rest. The hide is then cut to a predetermined shape to produce a leather sheet 10 that will fit over a particular vehicle component 8. An electronic circuit 20 is then printed, utilizing conductive ink, on the A-surface 14 of the leather sheet 10. The conductive ink can be applied through any method, and in an illustrative embodiment, is applied by one of (a) screen printing, (b) aerosol jet printing (c) inkjet printing. A light source 30 (e.g. micro LED's), or other electronic element 24, may be formed with or placed on the circuit 20. Then pigmented coating 16 can be applied over the circuit 20 and light source 30 to thereby produce a functional layered assembly 4. The functional layered assembly 4 can be placed in interior of a vehicle as an interior panel lining, door lining, or seat cover for example.

The present subject matter includes a method of producing a functional vehicle component 2. The functional vehicle component 2 may be, for example, a smart functional wireless charger 82, a smart functional vehicle seat 48, a smart functional steering wheel 58, a smart functional dashboard 76, or other smart functional vehicle component.

The functional vehicle component 2 may be produced by fixing a leather sheet 10 over a surface of a vehicle component 8, such that the leather sheet 10 is conformed to contours of the vehicle component 8. A flexible electronic circuit 20 is applied (e.g. printed) to an A-surface 14 of the leather sheet 10, and a pigmented coating 16 is arranged over the circuit 20. Visibility of the circuit 20 through the pigmented coating 16 is optionally concealed by the pigmented coating, and in one embodiment the circuit 120 is not visible through the pigmented coating 16. In an embodiment, the pigmented coating 16 is a pigmented layer, and a pigment loading in the pigmented coating 16 may be sufficient to inhibit or prevent the circuit 20 from being visible through the pigmented coating 16. The circuit 20 and the pigmented coating 16 may be applied to the leather sheet 10 before or after the leather sheet 10 is fixed over the surface 6 of the vehicle component 8. During fixing of the leather sheet 10 over the surface 6 of the vehicle component 8, the circuit 20 is conformed to contours of the surface 6 of the vehicle component 8. The method may further include applying a dielectric layer over the circuit 20, wherein the dielectric layer is arranged between the circuit 20 and the pigmented coating 16.

The method may include electrically connecting the circuit 20 to a vehicle ECU 26, to a vehicle power source 44, a vehicle HMI 28, or other vehicle systems, and such connections may be made directly by a wire, or through an intermediary microcontroller 46 located at an edge of the leather sheet 10.

The method may include providing a light source 30 that emits light when activated, and electrically connecting the light source to the circuit 20. The light source 30 may comprise one or more individual light emitter elements 32, such as a micro LED, which may be connected to the circuit 20 for example by soldering of electrical contacts or other method. The light source 30 is arranged within the flexible circuit layer 12 and directly in contact with the circuit 20. As such, the pigmented coating 16 is arranged over the circuit 20 and over the light source 30. Visibility of the light source 30 through the pigmented coating 16 may be inhibited, by the pigmented coating 16, and in one embodiment the light source 30 is not visible through the pigmented coating 16, but light emitted by the light source 30 is visible through the pigmented coating 16. The light source 30 is arranged in such a way, or is configured to emit light in such a way that light emitted by the light source provides visual indicators that convey information to a vehicle occupant.

The method may include applying an acrylic urethane anti-soiling component over the A-surface of the leather sheet 10, wherein the anti-soiling component is included a) as part of the pigmented coating 16, or b) as a topcoat (i.e. an anti-soiling component layer 18) over the pigmented coating 16.

In an embodiment, the vehicle component 8 is a steering wheel 58, the circuit 20 includes pressure sensors 38, and the pressure sensors 38 are arranged around the entire circumference of the steering wheel 58.

In another embodiment, the vehicle component 8 is a seat 48, the circuit 20 includes a biometric sensor 38, which is configured to measure biometrics of a user sitting on the seat 48.

The method may include applying a second flexible electronic circuit to the A-surface 14 of the leather sheet 10. The second flexible electronic circuit may be similar to the first flexible electronic circuit, such that the pigmented coating 16 is arranged over the second circuit. As such, the pigmented coating 16 may inhibit or prevent the second circuit from being visible through the pigmented coating 16. The second circuit is configured to perform a different function than the first circuit, which may mean that each circuit is electrically isolated/separated from the other circuit, or that each circuit can be independently operated, or that each circuit can function separately from the other circuits. In one embodiment, the second circuit is electrically isolated from the first circuit.

In an embodiment, the second circuit includes a wireless transmitter 34, which is configured to generate an oscillating electromagnetic field 36 when an associated portable electronic device 42 is within a predetermined distance from the wireless transmitter 34. The light source 30 may be configured to emit light that indicates a location of the wireless transmitter 34 when the portable electronic device 42 is within a predetermined distance from the wireless transmitter 34.

In another embodiment, the second circuit may include a switch 40, such as a capacitive or piezoelectric switch, that is operable to make or break a conductive path 22 in the second circuit; and the light source 30 is configured to emit light that indicates a location of the switch 40.

The present subject matter also includes a method of producing a vehicle system 84. The method includes applying a flexible electronic circuit 20 to an A-surface 14 of a leather sheet 10. A light source 30 is electrically connected to the circuit 20. The light source 30 is configured to emit light when supplied with electrical power. A pigmented coating 16 is arranged over the circuit 20 and over the light source 30. The method includes fixing the leather sheet 10 over a surface 6 of a vehicle component 8 such that the A-surface 14 of the leather sheet 10 is facing away from the vehicle component 8. The circuit 20 is electrically connected to a vehicle electronic control unit 26 and a vehicle power source 44. The pigmented coating 16 optionally inhibits or prevent the circuit 20 and the light source 30 from being visible through the pigmented coating 16. However, light emitted by the light source 30 is visible through the pigmented coating 16. In one embodiment, the vehicle component 8 comprises an interior panel, a door, a seat, a steering wheel, a dashboard, a center console, or a gear shifter.

A method of producing a functional leather component may include providing a leather sheet 10; applying to an A-surface 14 of the leather sheet 10, a flexible electronic circuit 12 including a piezoelectric switch 40 that can be actuated to make or break a conductive path 22 in the circuit 12; and arranging a pigmented coating 16 over the circuit 12. When a user actuates the switch 40 to make or break the conductive path 22 in the circuit 12, the piezoelectric switch 40 provides haptic feedback to the user that the piezoelectric switch 40 has been actuated. The pigmented coating 16 may inhibit or prevent the circuit 12 including the piezoelectric switch 40 from being visible through the pigmented coating 16. The piezoelectric switch 40 may be applied to the A-surface 14 of the leather sheet 10 by printing a piezoelectric material on the A-surface 14 of the leather sheet 10. The leather sheet 10, the flexible electronic circuit 12, and the pigmented coating 16 may then be embossed to impart an embossed pattern over the A-surface 14 of the leather sheet 10. Embossing may include passing the leather sheet 14, the flexible electronic circuit 12, and the pigmented coating 16 through a roll-to-roll embosser. A light source 30 may be provided that emits light when electrical power is supplied to the light source 30. The light source 30 may be electrically connected to the circuit 12. The pigmented coating 16 may be arranged over the light source 30, and may inhibit or prevent the light source 30 from being visible through the pigmented coating 16. However, light emitted by the light source 30 may be visible through the pigmented coating 16. The light source 30 may include a micro light emitting diode and may be configured to emit light that indicates a location of the piezoelectric switch 40. An acrylic urethane anti-soiling component may be applied over the A-surface 14 of the leather sheet 10. The anti-soiling component may be included a) as part of the pigmented coating 16, or b) as a top coat 18 over the pigmented coating 16. The leather sheet 10 may be fixed over a surface 6 of a vehicle component 8. During fixing, the circuit 12 may conform to contours of the surface 6 of the vehicle component 8. The vehicle component 8 may include a steering wheel, a seat, an arm rest, a center console, a dashboard, an interior panel, a door, a gear shifter, or combinations thereof.

A method of producing a functional vehicle component 2 may include applying to the A-surface 14 of the leather sheet 10, a flexible electronic circuit 12 including a piezoelectric switch 40 that is actuatable to make or break a conductive path 22 in the circuit 12; arranging the pigmented coating 16 over the A-surface 14 of the leather sheet 10 and over the flexible electronic circuit 12 including the piezoelectric switch 40; fixing the leather sheet 10 over the surface 6 of the vehicle component 8 such that the A-surface 14 of the leather sheet 10 is facing away from the vehicle component 8; and connecting the circuit 12 to a vehicle electronic control unit 26 and a vehicle power source 44. Upon actuation of the piezoelectric switch 40 to make or break the conductive path 22 in the circuit 12, the piezoelectric switch 40 may provide a haptic signal that indicates the actuation of the piezoelectric switch 40. The pigmented coating 16 may inhibit or prevent the circuit 12 including the piezoelectric switch 40 from being visible through the pigmented coating 16. The vehicle component may include a steering wheel, a seat, an arm rest, a center console, a dash board, interior panel, a door, a gear shifter, or combinations thereof.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of producing a functional leather component, comprising:
   providing a leather sheet;
   applying to a first side of the leather sheet, a flexible electronic circuit including a piezoelectric switch that can be actuated to make or break a conductive path in the circuit; and
   arranging a pigmented coating over the circuit;
   wherein the pigmented coating comprises pigment dispersed in a cured polymer film;
   wherein when the switch is actuated to make or break the conductive path in the circuit, the piezoelectric switch provides haptic feedback that the piezoelectric switch has been actuated.

2. The method according to claim 1, wherein the piezoelectric switch is applied to the first side of the leather sheet by printing a piezoelectric material on the first side of the leather sheet.

3. The method according to claim 1, further comprising embossing the leather sheet and the flexible electronic circuit to impart an embossed pattern over the first side of the leather sheet.

4. The method according to claim 3, wherein embossing includes passing the leather sheet and the flexible electronic circuit through a roll-to-roll embosser.

5. The method according to claim 1, wherein:
   the pigmented coating has a pigment loading sufficient to camouflage the circuit; and
   the first side is the grain side of the leather sheet.

6. The method according to claim 5, further comprising:
   providing a light source that emits light when electrical power is supplied to the light source, and
   electrically connecting the light source to the circuit,
   wherein the pigmented coating is arranged over the light source, wherein light emitted by the light source is visible through the pigmented coating, wherein the light source comprises a micro light emitting diode, and wherein the light source is configured to emit light that indicates a location of the piezoelectric switch.

7. The method according to claim 5, further comprising applying an acrylic urethane anti-soiling component over the first side of the leather sheet, wherein the anti-soiling component is included a) as part of the pigmented coating, or b) as a top coat over the pigmented coating.

8. The method according to claim 1, further comprising fixing the leather sheet over a surface of a vehicle component, wherein during fixing, the circuit conforms to contours of the surface of the vehicle component.

9. The method according to claim 8, wherein the vehicle component is selected from the group consisting of a steering wheel, a seat, an arm rest, a center console, a dashboard, an interior panel, a door, a gear shifter, and combinations thereof.

10. A functional vehicle component comprising a vehicle component covered by a functional leather assembly, wherein:
the functional leather assembly includes:
a leather sheet covering the vehicle component; and
a flexible electronic circuit arranged on an outermost surface of the leather sheet that faces away from the vehicle component, the flexible electronic circuit including a piezoelectric switch that can be actuated to make or break a conductive path in the circuit; and
upon actuation of the piezoelectric switch to make or break the conductive path in the circuit, the piezoelectric switch provides a haptic signal that indicates the actuation of the piezoelectric switch.

11. The functional vehicle component according to claim 10, wherein the piezoelectric switch includes a printed piezoelectric material arranged between two conductive layers.

12. The functional vehicle component according to claim 10, wherein the functional leather assembly includes an embossed pattern over the outermost surface of the leather sheet and over the flexible electronic circuit.

13. The functional vehicle component according to claim 10, wherein the circuit further includes a light source.

14. The functional vehicle component according to claim 13, wherein:
the light source comprises a micro light emitting diode; and
the light emitted by the light source indicates a location of the piezoelectric switch.

15. The functional vehicle component according to claim 10, further comprising a pigmented coating arranged over the circuit, including the piezoelectric switch.

16. The functional vehicle component according to claim 15, wherein the functional leather assembly further includes an acrylic urethane anti-soiling component over the outermost surface of the leather sheet, wherein the anti-soiling component is included a) as part of the pigmented coating, or b) as a top coat over the pigmented coating.

17. The functional vehicle component according to claim 10, wherein:
the functional leather assembly is fixed over a surface of the vehicle component, and
the circuit conforms to contours of the surface of the vehicle component.

18. The functional vehicle component according to claim 10, wherein the vehicle component is selected from the group consisting of a steering wheel, a seat, an arm rest, a center console, a dashboard, an interior panel, a door, a gear shifter, and combinations thereof.

19. A method of producing a functional vehicle component, comprising:
applying to a first surface of a leather sheet, a flexible electronic circuit including a piezoelectric switch that is actuatable to make or break a conductive path in the circuit;
fixing the leather sheet over a surface of a vehicle component such that the first surface of the leather sheet is facing away from the vehicle component to thereby define an outermost surface of the leather sheet; and
connecting the circuit to a vehicle electronic control unit and a vehicle power source;
wherein upon actuation of the piezoelectric switch to make or break the conductive path in the circuit, the piezoelectric switch provides a haptic signal that indicates the actuation of the piezoelectric switch.

20. The method according to claim 19, wherein:
the method further comprises arranging a pigmented coating over the first surface of the leather sheet and over the flexible electronic circuit including the piezoelectric switch; and
the vehicle component is selected from the group consisting of a steering wheel, a seat, an arm rest, a center console, a dash board, interior panel, a door, a gear shifter, and combinations thereof.

* * * * *